(12) United States Patent
Hwang et al.

(10) Patent No.: US 12,224,256 B2
(45) Date of Patent: Feb. 11, 2025

(54) WAFER STRUCTURE AND SEMICONDUCTOR DEVICE

(71) Applicant: Samsung Electronics Co., Ltd., Suwon-si (KR)

(72) Inventors: Hyunsu Hwang, Siheung-si (KR); Junyun Kweon, Cheonan-si (KR); Jumyong Park, Cheonan-si (KR); Solji Song, Suwon-si (KR); Dongjoon Oh, Suwon-si (KR); Chungsun Lee, Asan-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 487 days.

(21) Appl. No.: 17/711,370

(22) Filed: Apr. 1, 2022

(65) Prior Publication Data

US 2023/0073690 A1 Mar. 9, 2023

(30) Foreign Application Priority Data

Sep. 3, 2021 (KR) .................. 10-2021-0117875

(51) Int. Cl.
*H01L 23/00* (2006.01)
*H01L 23/522* (2006.01)
*H01L 23/544* (2006.01)

(52) U.S. Cl.
CPC .......... *H01L 24/05* (2013.01); *H01L 23/5226* (2013.01); *H01L 23/544* (2013.01); *H01L 23/562* (2013.01); *H01L 2223/54426* (2013.01); *H01L 2224/0557* (2013.01); *H01L 2224/05582* (2013.01); *H01L 2924/37001* (2013.01)

(58) Field of Classification Search
CPC ... H01L 24/05; H01L 25/0657; H01L 23/544; H01L 2223/54426; H01L 23/5226; H01L 23/481; H01L 21/78; H01L 21/76898
See application file for complete search history.

(56) References Cited

U.S. PATENT DOCUMENTS

| | | | |
|---|---|---|---|
| 9,070,748 B2 | 6/2015 | Kang et al. | |
| 9,142,517 B2 | 9/2015 | Liu et al. | |
| 10,128,224 B2 | 11/2018 | Park et al. | |
| 10,553,488 B2* | 2/2020 | Gong | H01L 21/76898 |
| 2011/0217841 A1* | 9/2011 | Chen | H01L 21/76898 |
| | | | 257/E21.597 |
| 2012/0001337 A1* | 1/2012 | Tsai | H01L 23/544 |
| | | | 257/E23.161 |

(Continued)

*Primary Examiner* — Bac H Au
(74) *Attorney, Agent, or Firm* — Harness, Dickey & Pierce, P.L.C.

(57) ABSTRACT

A wafer structure includes a semiconductor substrate that includes a chip region and a scribe lane region. A first dielectric layer is on a first surface of the semiconductor substrate, a second dielectric layer is on the first dielectric layer. A dielectric pattern is between the first dielectric layer and the second dielectric layer. A through via that penetrates the first surface and a second surface at the chip region of the semiconductor substrate, and a conductive pad is in the second dielectric layer and on the through via. The dielectric pattern includes an etch stop pattern on the chip region of the semiconductor substrate and in contact with a bottom surface of the conductive pad, and an alignment key pattern on the scribe lane region of the semiconductor substrate.

20 Claims, 32 Drawing Sheets

(56) References Cited

U.S. PATENT DOCUMENTS

2013/0264720 A1* 10/2013 Chun ................ H01L 21/76898
                                                         257/774
2018/0108540 A1    4/2018  Phee et al.
2020/0402960 A1   12/2020  Chen et al.
2021/0143102 A1    5/2021  Ko et al.

* cited by examiner

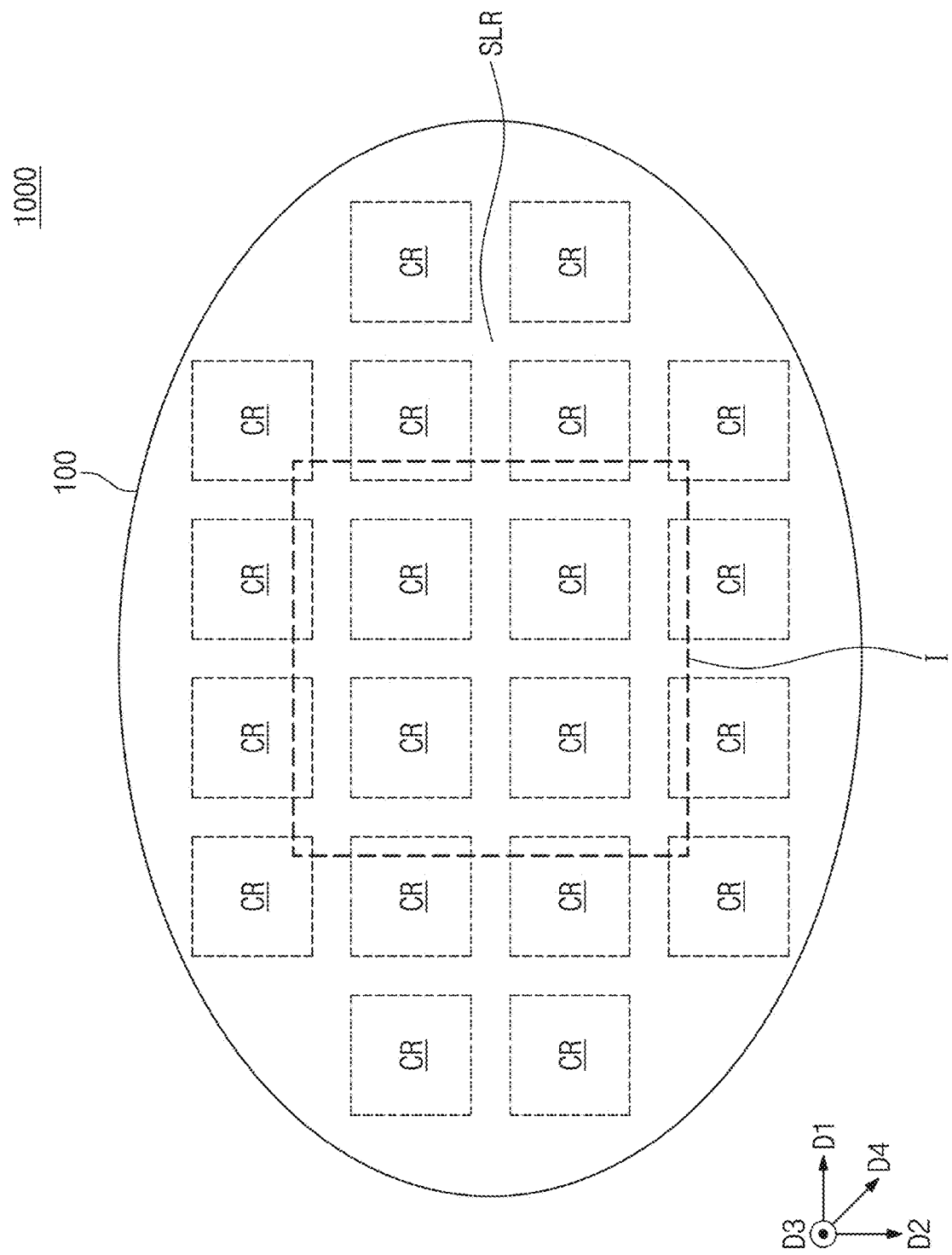

WAFER STRUCTURE AND SEMICONDUCTOR DEVICE

CROSS-REFERENCE TO RELATED APPLICATION

This U.S. nonprovisional application claims priority under 35 U.S.C § 119 to Korean Patent Application No. 10-2021-0117875 filed on Sep. 3, 2021 in the Korean Intellectual Property Office, the disclosure of which is hereby incorporated by reference in its entirety.

BACKGROUND

The present inventive concepts relate to a wafer structure and a semiconductor device fabricated using the same.

The development of the electronics industry may provide low price electronic products having characteristics such as light weight, compact size, high speed, and high performance. A wafer substrate may be used in fabricating semiconductor devices. The wafer substrate may include a plurality of chip regions. The wafer substrate may be diced into a plurality of semiconductor devices that are separated from each other. The dicing process of substrates can problematically induce damage to the semiconductor devices.

SUMMARY

Some embodiments of the present inventive concepts provide a highly reliable semiconductor device and a method of fabricating the same.

Some embodiments of the present inventive concepts provide a semiconductor device and a method of fabricating the same, which method increases a manufacturing yield.

According to some embodiments of the present inventive concepts, a wafer structure may include a semiconductor substrate that includes a chip region and a scribe lane region. A first dielectric layer is on a first surface of the semiconductor substrate. A second dielectric layer is on the first dielectric layer. A dielectric pattern is between the first dielectric layer and the second dielectric layer. A through via penetrates the first surface and a second surface at the chip region of the semiconductor substrate and a conductive pad is in the second dielectric layer and on the through via. The dielectric pattern may include an etch stop pattern on the chip region of the semiconductor substrate and in contact with a bottom surface of the conductive pad and an alignment key pattern on the scribe lane region of the semiconductor substrate.

According to some embodiments of the present inventive concepts, a semiconductor device may include a semiconductor substrate that has a chip region and a dummy region that surrounds the chip region, in a plan view; a. A first dielectric layer is on a first surface of the semiconductor substrate. A second dielectric layer is on the first dielectric layer. A dielectric pattern is between the first dielectric layer and the second dielectric layer. A through via penetrates the first surface and a second surface at the chip region of the semiconductor substrate and a conductive pad is in the second dielectric layer and on the through via. The dielectric pattern may be spaced apart from a sidewall of the through via. The dielectric pattern may include an etch stop pattern on the chip region of the semiconductor substrate and in contact with a bottom surface of the conductive pad and a dummy dielectric pattern on the dummy region of the semiconductor substrate.

According to some embodiments of the present inventive concepts, a wafer structure may include a semiconductor substrate that includes a chip region and a scribe lane region. A plurality of integrated circuits are on a second surface at the chip region of the semiconductor substrate. A circuit layer is on the second surface of the semiconductor substrate, the circuit layer including a dielectric layer and a wiring structure, the wiring structure being in the dielectric layer and coupled to the integrated circuits. A lower conductive pad is on a bottom surface of the circuit layer and coupled to the wiring structure. A first dielectric layer is on a first surface at the chip region and the scribe lane region of the semiconductor substrate. A second dielectric layer is on the first dielectric layer. A dielectric pattern is between the first dielectric layer and the second dielectric layer. A through via penetrates the first dielectric layer and the chip region of the semiconductor substrate and a conductive pad is in the second dielectric layer and on the through via, the conductive pad being coupled to the through via. The through via may include a barrier pattern and a conductive via. The barrier pattern may be between the semiconductor substrate and the conductive via. The conductive pad may include a barrier pad and a metal pad on the barrier pad. The dielectric pattern may include a material different from a material of the first dielectric layer and different from a material of the second dielectric layer. The dielectric pattern may include: an etch stop pattern on the chip region of the semiconductor substrate and in contact with a bottom surface of the conductive pad; and an alignment key pattern on the scribe lane region of the semiconductor substrate.

BRIEF DESCRIPTION OF THE DRAWINGS

The drawings described herein are for illustrative purposes only of selected embodiments and not all possible implementations, and are not intended to limit the scope of the present disclosure.

FIG. 1A illustrates a plan view showing a wafer structure according to some embodiments.

DETAILED DESCRIPTION OF EMBODIMENTS

Figure 1B:
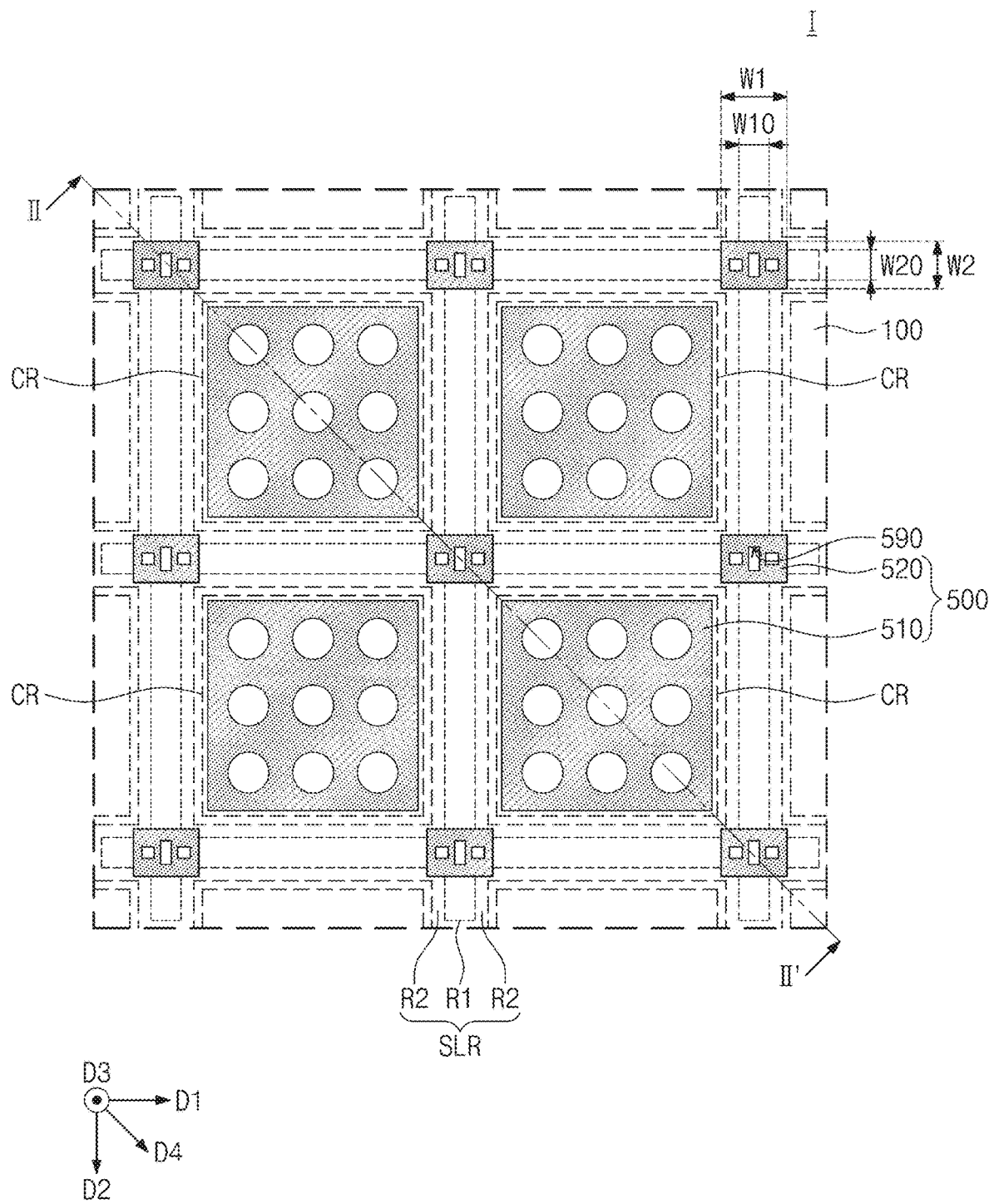
FIG. 1B illustrates an enlarged view showing section I of FIG. 1A.

In this description, like reference numerals may indicate like components. The following will now describe wafer structures, semiconductor devices, semiconductor packages, and their fabricating methods.

Figure 1C:
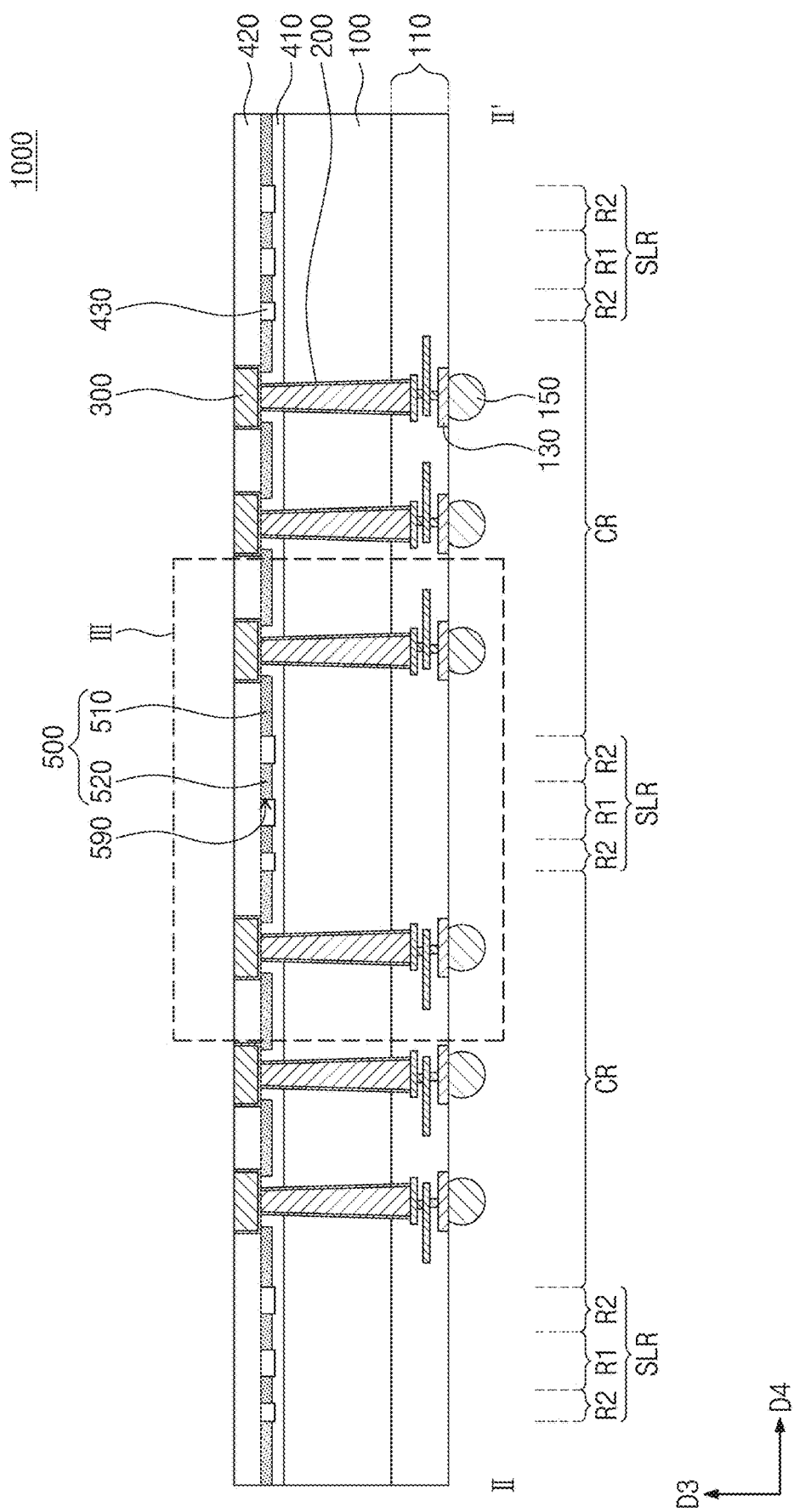
FIG. 1C illustrates a cross-sectional view taken along line II-II' of FIG. 1B.
Figure 1D:
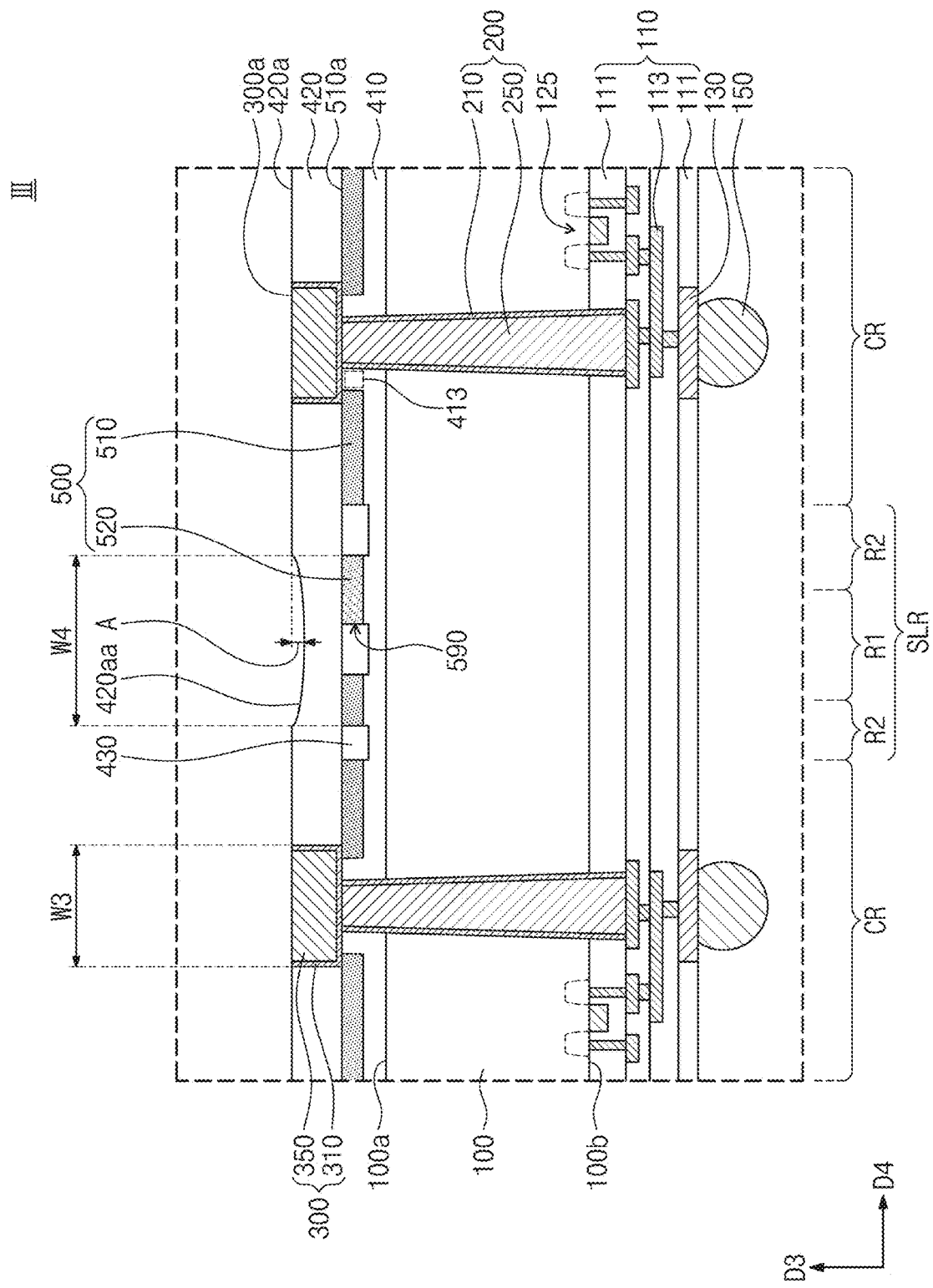
FIG. 1D illustrates an enlarged view showing section III of FIG. 1C.

FIG. 1A illustrates a plan view showing a wafer structure according to some embodiments. FIG. 1B illustrates an enlarged view showing section I of FIG. 1A. FIG. 1C illustrates a cross-sectional view taken along line II-II' of FIG. 1B. FIG. 1D illustrates an enlarged view showing section III of FIG. 1C.

Referring to FIGS. 1A to 1D, a wafer structure 1000 may include a semiconductor substrate 100, lower conductive pads 130, a circuit layer 110, through vias 200, conductive pads 300, a first dielectric layer 410, a second dielectric layer 420, a third dielectric layer 430, and dielectric patterns 500.

As shown in FIGS. 1A and 1B, when viewed in plan, the semiconductor substrate 100 may have chip regions CR and a scribe lane region SLR. Each of the chip regions CR may be an area that is used as a substrate for a semiconductor device (see 10 of FIG. 3A) which will be discussed below. Chip regions CR of the semiconductor substrate 100 may be separated from each other by the scribe lane region SLR. The chip regions CR may be spaced apart from each other in a first direction D1 or in a second direction D2. For example, the chip regions CR may be arranged along rows parallel to the first direction D1 and along columns parallel to the second direction D2.

The first direction D1 may be parallel to a first surface 100a of the semiconductor substrate 100. The first direction D1 may be parallel to a major axis of the semiconductor substrate 100. The second direction D2 may be parallel to the first surface 100a of the semiconductor substrate 100 and substantially perpendicular to the first direction D1. A third direction D3 may be substantially perpendicular to the first surface 100a of the semiconductor substrate 100 and may intersect the first direction D1 and the second direction D2. A fourth direction D4 may be parallel to the first surface 100a of the semiconductor substrate 100 and may intersect the first direction D1 and the second direction D2. The fourth direction D4 may be a diagonal direction. The fourth direction D4 may be substantially orthogonal to the third direction D3.

The scribe lane region SLR may be disposed between the chip regions CR of the semiconductor substrate 100. The scribe lane region SLR may surround each of the chip regions CR. The scribe lane region SLR may be an imaginary area. The scribe lane region SLR may include a dicing region R1 and a dummy region R2. The dicing region R1 of the scribe lane region SLR may be an area that is removed in a dicing process which will be discussed in FIGS. 3A and 3B. A range of about 80 μm to about 150 μm may be given to a width W10 in the first direction D1 of the dicing region R1. A range of about 80 μm to about 150 μm may be given to a width W20 in the second direction D2 of the dicing region R1.

The dummy region R2 may be provided between the dicing region R1 and the chip regions CR. The presence of the dummy region R2 may prevent or mitigate damage to components of the chip region CR in a dicing process.

The scribe lane region SLR may include first regions, second regions, and intersection regions. Each of the first regions of the scribe lane region SLR may extend in a direction parallel to the first direction D1, and each of the second regions of the scribe lane region SLR may extend in a direction parallel to the second direction D2. The interconnection regions may be areas where the first regions meet the second regions.

The dielectric patterns 500 may include etch stop patterns 510 and alignment key patterns 520. The etch stop patterns 510 may be provided on the chip regions CR. The alignment key patterns 520 may be spaced apart from the etch stop patterns 510. When viewed in plan, the alignment key patterns 520 may be correspondingly provided on the intersection regions of the scribe lane region SLR. A width W1 in the first direction D1 of the alignment key pattern 520 may be greater than the width W10 of the dicing region R1. For example, a range of about 30 μm to about 180 μm may be given to the width W1 in the first direction D1 of the alignment key pattern 520. For more detail, a range of about 140 μm to about 180 μm may be given to the width W1 in the first direction D1 of the alignment key pattern 520. A range of about 30 μm to about 180 μm may be given to a width W2 in the second direction D2 of the alignment key pattern 520.

Differently from that shown, the width W2 in the second direction D2 of the alignment key pattern 520 may be greater than the width W20 of the dicing region R1, and the width W1 in the first direction D1 of the alignment key pattern 520 may be less than the width W10 of the dicing region R1. Alternatively, the width W1 in the first direction D1 and the width W2 in the second direction D2 of the alignment key pattern 520 may be respectively greater than the width W10 in the first direction D1 and the width W20 in the second direction D2 of the dicing region R1. When a value of equal to or less than about 30 μm is given to the width W1 in the first direction D or the width W2 in the second direction D2 of the alignment key pattern 520, it may be difficult to recognize the alignment key patterns 520 in a following process for forming the wafer structure 1000. When a value of equal to or greater than about 180 μm is given to the width W1 in the first direction D or the width W2 in the second direction D2 of the alignment key pattern 520, the alignment key patterns 520 may extend onto the chip regions CR. This case may impose a limitation on arrangement of the conductive pads 300 which will be discussed below in FIGS. 1C and 1D.

Referring to FIG. 1C, the circuit layer 110 may be provided on the second surface 100b of the semiconductor substrate 100. The through vias 200 may be provided on the chip regions CR of the semiconductor substrate 100. The through vias 200 may penetrate the semiconductor substrate 100 and may further penetrate at least a portion of the circuit layer 110. The circuit layer 110 may be provided with solder balls 150 on a bottom surface thereof. The through vias 200 may be electrically connected to the solder balls 150. The solder balls 150 may overlap the chip regions CR of the semiconductor substrate 100. The solder balls 150 may include a solder material, such as tin, lead, silver, or an alloy thereof.

The first dielectric layer 410 may be provided on the first surface 100a of the chip regions CR and the scribe lane region SLR of the semiconductor substrate 100. The second dielectric layer 420 may be provided on the first dielectric layer 410. The second dielectric layer 420 may overlap the first surface 100a of the chip regions CR and the scribe lane region SLR of the semiconductor substrate 100. The dielectric patterns 500 may be provided between the first dielectric layer 410 and the second dielectric layer 420. The dielectric patterns 500 may include the alignment key patterns 520 and the etch stop patterns 510. The alignment key patterns 520 may be provided on the scribe lane region SLR. The first dielectric layer 410 and the second dielectric layer 420 may be provided therebetween with the third dielectric layer 430 interposed between the dielectric patterns 500.

The conductive pads 300 may be provided in the second dielectric layer 420 and on the through vias 200. The conductive pads 300 may be coupled to the through vias 200. The conductive pads 300 may overlap the chip regions CR.

A wafer structure will be described in detail with reference to FIG. 1D. A single alignment key pattern 520 will be discussed in the interest of brevity of description.

Referring to FIGS. 1C and 1D, the wafer structure 1000 may further include integrated circuits 125. The integrated circuits 125 may be provided on the second surface 100b of the chip regions CR of the semiconductor substrate 100. The integrated circuits 125 may not be provided on the scribe lane region SLR of the semiconductor substrate 100. The integrated circuits 125 may include transistors.

The circuit layer 110 may be provided on the second surface 100b of the semiconductor substrate 100. The circuit layer 110 may include dielectric layers 111 and wiring structures 113. The dielectric layers 111 may be stacked on the second surface 100b of the scribe lane region SLR and the chip regions CR of the semiconductor substrate 100. An uppermost one of the dielectric layers 111 may cover the integrated circuits 125. The dielectric layers 111 may include a silicon-based dielectric material, such as one or more of silicon oxide, silicon oxide, silicon oxynitride, and silicon carbonitride. Alternatively, at least one of the dielectric layers 111 may include an organic material such as a dielectric polymer, but the present inventive concepts are not limited thereto.

The wiring structures 113 may be provided on the second surface 100b of the chip regions of the semiconductor substrate 100. The wiring structures 113 may include a contact plug, a wiring pattern, and a via. The wiring structures 113 may include metal, such as copper or tungsten. A contact plug may penetrate an uppermost dielectric layer 111 and may be coupled to at least one of the integrated circuits 125. The wiring patterns may be provided between the dielectric layers 111. The vias may penetrate the dielectric layers 111 and may be coupled to the wiring patterns. The wiring structures 113 may not be provided on the scribe lane region SLR.

The lower conductive pads 130 may be provided on the bottom surface of the circuit layer 110. For example, the lower conductive pads 130 may be provided in a lowermost one of the dielectric layers 111. The solder balls 150 may be provided on bottom surfaces of the lower conductive pads 130. The solder balls 150 may be electrically connected through the wiring structures 113 to the integrated circuits 125. The lower conductive pads 130 may include metal, such as copper or aluminum. Neither the lower conductive pads 130 nor the solder balls 150 may be provided on the scribe lane region SLR of the semiconductor substrate 100.

The through vias 200 may be provided on the chip regions CR of the semiconductor substrate 100 and may penetrate the first and second surfaces 100a and 100b of the semiconductor substrate 100. The through vias 200 may further penetrate at least one of the dielectric layers 111. The through vias 200 may be coupled to the wiring structures 113. Therefore, the through vias 200 may be coupled to the solder balls 150 or the integrated circuits 125. The through vias 200 may not be provided on the scribe lane region SLR of the semiconductor substrate 100. Upper portions of the through vias 200 may be provided in the first dielectric layer 410.

Each of the through vias 200 may include a barrier pattern 210 and a conductive via 250. The conductive via 250 may be disposed on the barrier pattern 210. The conductive via 250 may include metal, such as copper and tungsten. The barrier pattern 210 may be provided along a sidewall of the conductive via 250. For example, the barrier pattern 210 may be provided between the conductive via 250 and the semiconductor substrate 100, between the conductive via 250 and one of the dielectric layers 111, and between the conductive via 250 and the first dielectric layer 410. The barrier pattern 210 may not cover a top or bottom surface of the conductive via 250. The barrier pattern 210 may include at least one of titanium (Ti), titanium nitride (TiN), tantalum (Ta), and tantalum nitride (TaN). The barrier pattern 210 may prevent or reduce diffusion of materials included in the conductive via 250. The barrier pattern 210 may be a seed pattern.

The first dielectric layer 410 may cover the first surface 100a of the semiconductor substrate 100. The first dielectric layer 410 may include extension portions 413. The extension portions 413 of the first dielectric layer 410 may be provided along and may cover sidewalls of the through vias 200. The extension portions 413 of the first dielectric layer 410 may have their top surfaces coplanar with those of the through vias 200. Although not shown, each of the extension portions 413 of the first dielectric layer 410 may have a closed loop shape when viewed in plan. The first dielectric layer 410 may include silicon-based dielectric material. For example, the first dielectric layer 410 may include silicon oxide. The first dielectric layer 410 may serve as an adhesion layer.

The dielectric patterns 500 may be provided on the first dielectric layer 410. The dielectric patterns 500 may include a different material from that of the first dielectric layer 410 and that of the second dielectric layer 420. For example, the dielectric patterns 500 may include silicon-based dielectric material, such as silicon nitride.

As discussed above, the dielectric patterns 500 may include the alignment key patterns 520 and the etch stop patterns 510. The etch stop patterns 510 may be laterally spaced apart from the sidewalls of the through vias 200. The first dielectric layer 410 may be provided between the etch stop patterns 510 and the sidewalls of the through vias 200. For example, the extension portions 413 of the first dielectric layer 410 may be interposed between the etch stop patterns 510 and the sidewalls of the through vias 200. There may be a relatively small adhesion force between dielectric patterns 500 and the semiconductor substrate 100 and between the dielectric patterns 500 and the through vias 200 (or the barrier patterns 210). According to some embodiments, because the first dielectric layer 410 is provided between the dielectric patterns 500 and the semiconductor substrate 100 and between the dielectric patterns 500 and the through vias 200, the etch stop patterns 510 may be stably fixed through the first dielectric layer 410 to the semiconductor substrate 100 and the through vias 200. The dielectric patterns 500 may have their top surfaces located at substantially the same level as that of top surfaces of the through vias 200 and that of top surfaces of the extension portions 413 of the first dielectric layer 410. The phrase "certain components are the same in terms of width, height, and level" may include an allowable tolerance possibly occurring during fabrication process.

The alignment key pattern 520 may be provided on the scribe lane region SLR of the semiconductor substrate 100. For example, the alignment key pattern 520 may be provided on the dicing region R1 of the semiconductor substrate 100. The alignment key pattern 520 may further extend onto the dummy region R2 of the semiconductor substrate 100. A width in the fourth direction D4 of the alignment key pattern 520 may be greater than a width in the fourth direction D4 of the dicing region R1.

The alignment key pattern 520 may be laterally spaced apart from the etch stop patterns 510. The phrase "two components are laterally spaced apart from each other" may mean that "two components are horizontally spaced apart from each other." The language "horizontal" may mean that parallel to the first surface 100a of the semiconductor substrate 100. The alignment key pattern 520 may have a hole 590 that penetrates therethrough. The hole 590 may further penetrate the first dielectric layer 410. The hole 590 may have a bottom surface that is provided in the first dielectric layer 410. The alignment key pattern 520 may have a shape that is variously changed without being limited to the shape illustrated in the figures. For example, the alignment key pattern 520 may be formed without the hole 590.

The third dielectric layer 430 may be provided between the alignment key pattern 520 and the etch stop patterns 510. The third dielectric layer 430 may further be provided in the hole 590 of the alignment key pattern 520. The third dielectric layer 430 may further penetrate an upper portion of the first dielectric layer 410. The third dielectric layer 430 may have a bottom surface located at a level that is lower than that of bottom surfaces of the dielectric patterns 500 and higher than that of the first surface 100a of the semiconductor substrate 100. A level of a certain component may indicate a vertical level, and a level difference between two components may be measured in the third direction D3. The third dielectric layer 430 may include a different material from that of the dielectric patterns 500. For example, the third dielectric layer 430 may include the same material as that of the first dielectric layer 410. In this case, an indistinct interface may be provided between the first dielectric layer 410 and the third dielectric layer 430, but the present inventive concepts are not limited thereto. The third dielectric layer 430 may include a silicon-based dielectric material, such as silicon oxide.

The second dielectric layer 420 may be provided on the dielectric patterns 500 and the third dielectric layer 430. The second dielectric layer 420 may have a first top surface 420a and a second top surface 420aa. The first top surface 420a of the second dielectric layer 420 may be provided on the chip regions CR, and the second top surface 420aa of the second dielectric layer 420 may be provided on the scribe lane region SLR. The first top surface 420a of the second dielectric layer 420 may be located at a lower level than that of the second top surface 420aa of the second dielectric layer 420. The second dielectric layer 420 may include a silicon-based dielectric material, such as silicon oxide or silicon carbonitride.

The conductive pads 300 may be provided in the second dielectric layer 420 and on the through vias 200. The second dielectric layer 420 may surround sidewalls of the conductive pads 300. The conductive pads 300 may have their top surfaces 300a that are exposed by the second dielectric layer 420. The second top surface 420aa of the second dielectric layer 420 may be located at a lower level than that of the top surfaces 300a of the conductive pads 300. For example, there may be a level difference A ranging from about 0.01 µm to about 0.1 µm may be provided between the second top surface 420aa of the second dielectric layer 420 and the top surfaces 300a of the conductive pads 300. In this case, the top surfaces 300a of the conductive pads 300 may be top surfaces at edge regions of the conductive pads 300. The level difference A may be a maximum level difference.

The conductive pads 300 may be provided on and electrically connected to the through vias 200. For example, the conductive pads 300 may be electrically connected through the through vias 200 to the integrated circuits 125 or to the solder balls 150. The conductive pads 300 may further be provided on the extension portions 413 of the first dielectric layer 410 and on the etch stop patterns 510. For example, the conductive pads 300 may have their bottom surfaces in physical contact with top surfaces 510a of the etch stop patterns 510.

Each of the conductive pads 300 may include a barrier pad 310 and a metal pad 350. The barrier pad 310 may cover a bottom surface and a sidewall of the metal pad 350, but may expose a top surface of the metal pad 350. The barrier pad 310 may include at least one selected from titanium (Ti), titanium nitride (TiN), tantalum (Ta), and tantalum nitride (TaN). The metal pad 350 may include, for example, copper.

According to some embodiments, the alignment key pattern 520 may have a size greater than those of the conductive pads 300. For example, a width W4 in the fourth direction D4 of the alignment key pattern 520 may be greater than widths W3 in the fourth direction D4 of the conductive pads 300. When the alignment key pattern 520 is provided on the chip regions CR of the semiconductor substrate 100, the alignment key pattern 520 may impose a limitation on arrangement of the conductive pads 300 and the through vias 200. According to some embodiments, because the alignment key pattern 520 is provided on the scribe lane region SLR of the semiconductor substrate 100, it may be possible to freely design an arrangement of the conductive pads 300 and the through vias 200. For example, the conductive pads 300 may have a fine pitch.

According to some embodiments, no conductive component may be provided on the scribe lane region SLR of the semiconductor substrate 100.

Figure 1E:
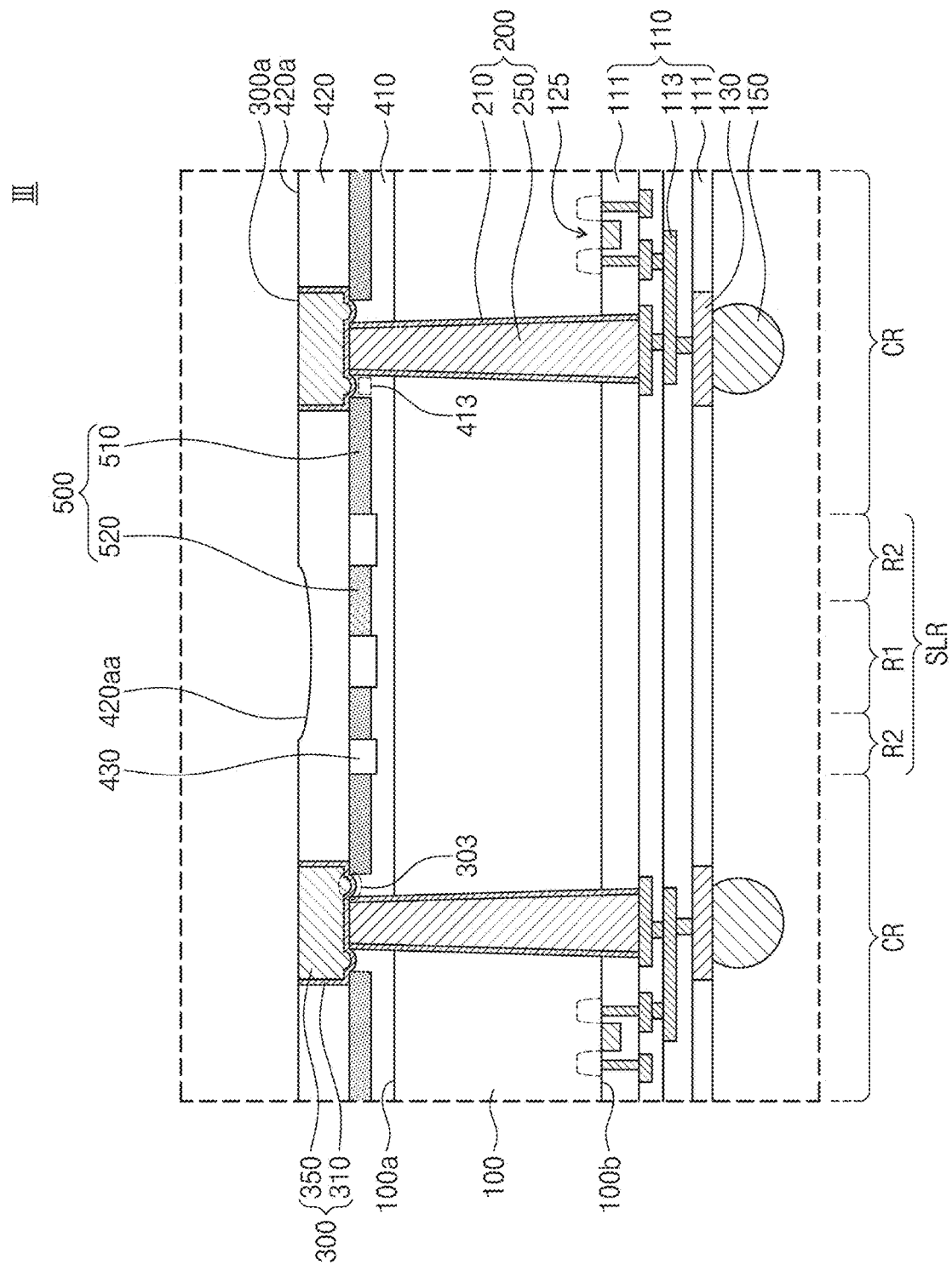
FIG. 1E illustrates a cross-sectional view showing conductive pads and through vias according to some embodiments.

FIG. 1E illustrates an enlarged view of section III depicted in FIG. 1C, showing conductive pads and through vias according to some embodiments.

Referring to FIG. 1E, the conductive pads 300 may have protrusions 303. For example, the protrusions 303 may be provided on the bottom surfaces of the conductive pads 300, while protruding into the first dielectric layer 410. For example, the protrusions 303 may protrude into the extension portions 413 of the first dielectric layer 410. The protrusions 303 may be interposed between the conductive pads 300 and the etch stop patterns 510. The protrusions 303 may not be provided on the etch stop patterns 510. The extension portions 413 of the first dielectric layer 410 may have their top surfaces located at a lower level than that of the top surfaces 510a of the etch stop patterns 510 and that of the top surfaces of the through vias 200.

The through vias 200 may penetrate the first and second surfaces 100a and 100b of the semiconductor substrate 100, but may not penetrate the dielectric layer 111. For example, the through vias 200 may be formed in a via-first process. Alternatively, as discussed in the embodiment of FIG. 1D, the through vias 200 may further penetrate at least one of the dielectric layers 111.

Figure 1F:
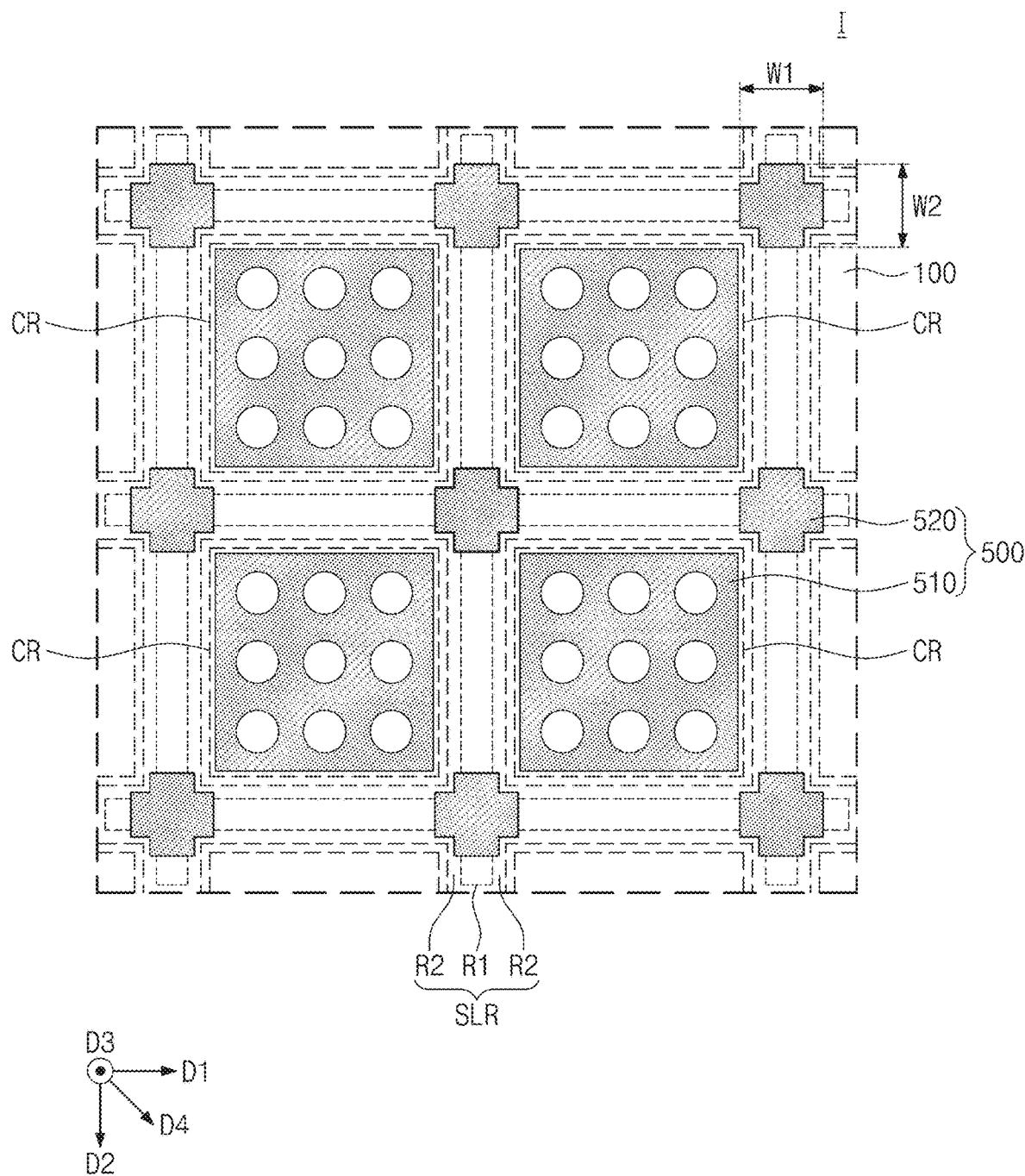
FIG. 1F illustrates a plan view showing an alignment key according to some embodiments.

FIG. 1F illustrates an enlarged view of section I depicted in FIG. 1B, showing an alignment key according to some embodiments.

Referring to FIG. 1F, the alignment key pattern 520 may have a cross shape. The alignment key pattern 520 may be provided on the dicing region R1 of the scribe lane region SLR. The alignment key pattern 520 may further extend onto the dummy region R2. The width W1 in the first direction D1 and the width W2 in the second direction D2 of the alignment key pattern 520 may satisfy a condition discussed in the embodiment of FIG. 1D.

The following will describe a method of fabricating a wafer structure according to some embodiments.

FIGS. 2A to 2L illustrate enlarged views of section III depicted in FIG. 1C, showing a method of fabricating a wafer structure according to some embodiments of the present inventive concepts. A description duplicate with the aforementioned will be omitted hereinafter.

Figure 2A:
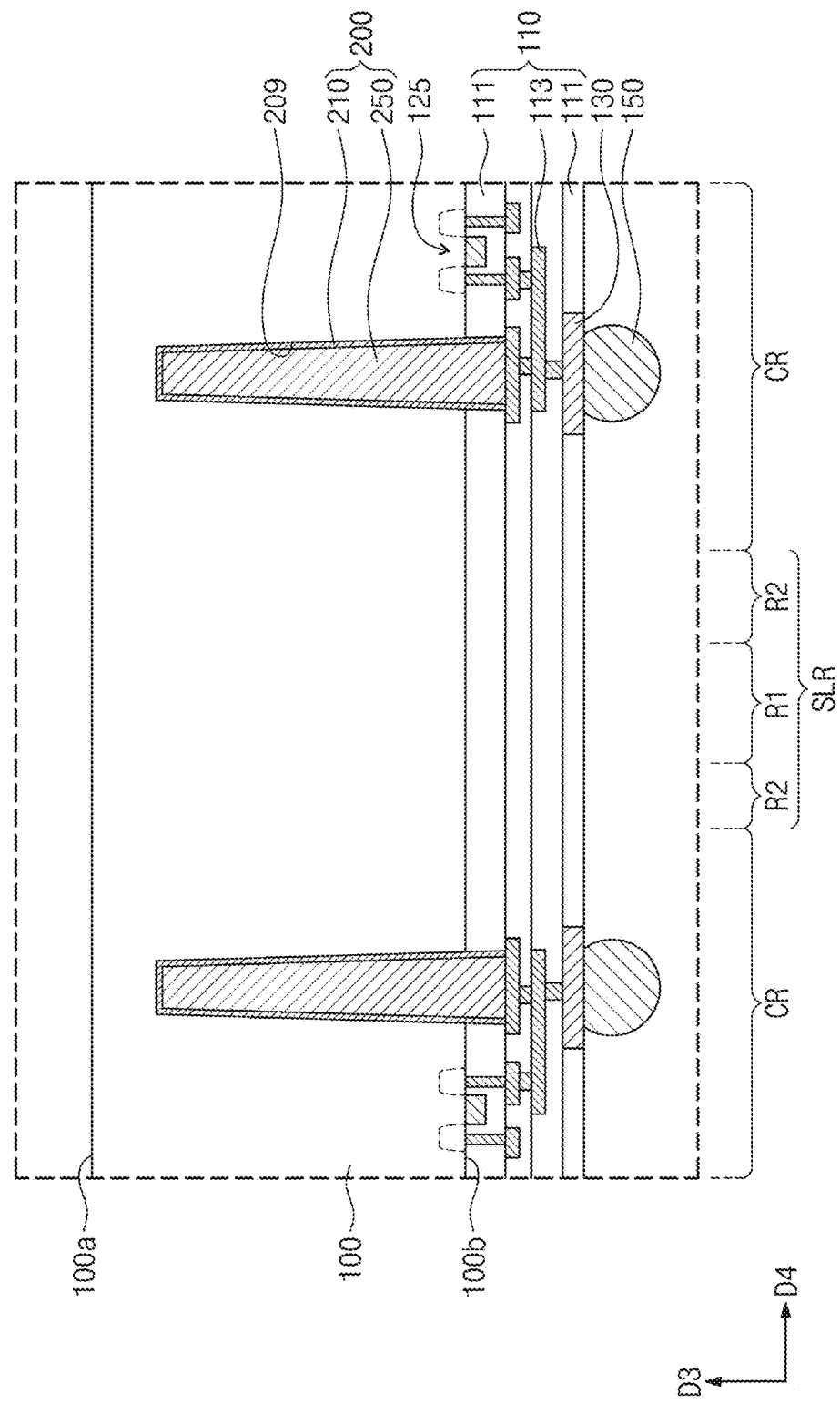
FIGS. 2A to 2L illustrate cross-sectional views showing a method of fabricating a wafer structure according to some embodiments.

Referring to FIG. 2A, a semiconductor substrate 100 may be prepared. Integrated circuits 125 and a circuit layer 110 may be formed on a second surface 100b of the semiconductor substrate 100, and through vias 200 may be formed in the semiconductor substrate 100. The through vias 200 may be formed in a via-middle process. Alternatively, the through vias 200 may be formed in a via-first process. In this case, the through vias 200 may not penetrate a dielectric layer 111.

According to some embodiments, a through hole 209 may be formed to penetrate the second surface 100b of the semiconductor substrate 100. The through hole 209 may further penetrate the dielectric layer 111. The through hole 209 may have a bottom surface that is provided in the semiconductor substrate 100. A barrier pattern 210 may be formed in the through hole 209 to conformally cover a sidewall and the bottom surface of the through hole 209. The barrier pattern 210 may serve as a seed pattern. For example, an electroplating process may be performed in which the barrier pattern 210 is used as an electrode. The electroplating process may fill the through hole 209 with a conductive material to form a conductive via 250.

Figure 2B:
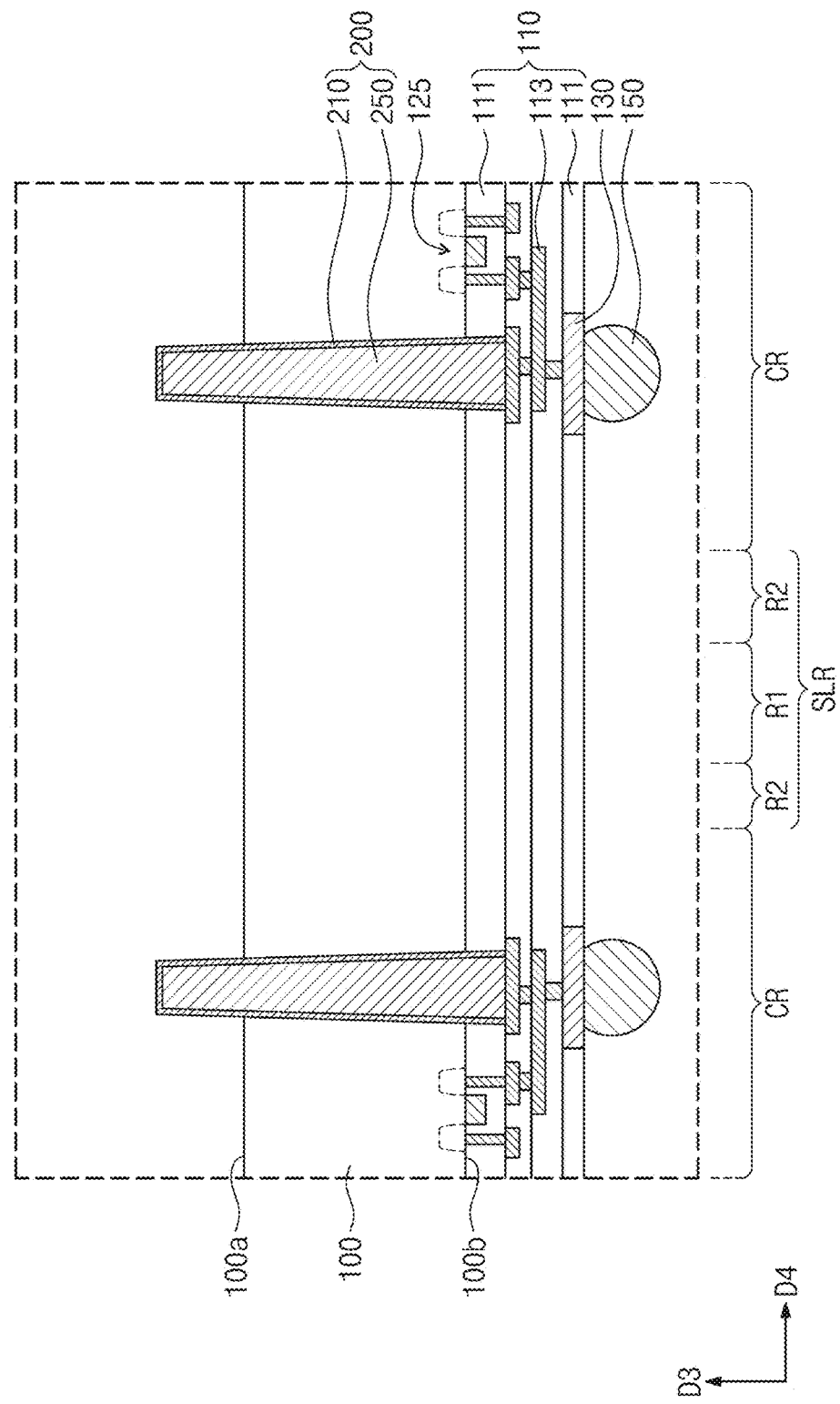

Referring to FIG. 2B, an upper portion of the semiconductor substrate 100 may be removed to thin the semiconductor substrate 100. The thinning of the semiconductor substrate 100 may include performing a planarization process or an etch-back process on the second surface 100b of the semiconductor substrate 100. The planarization process may be a chemical mechanical polishing process. While the semiconductor substrate 100 is thinned, the through vias 200 may not be removed. The semiconductor substrate 100 may be thinned such that upper portions of the through vias 200 may protrude onto a first surface 100a of the semiconductor substrate 100.

Figure 2C:
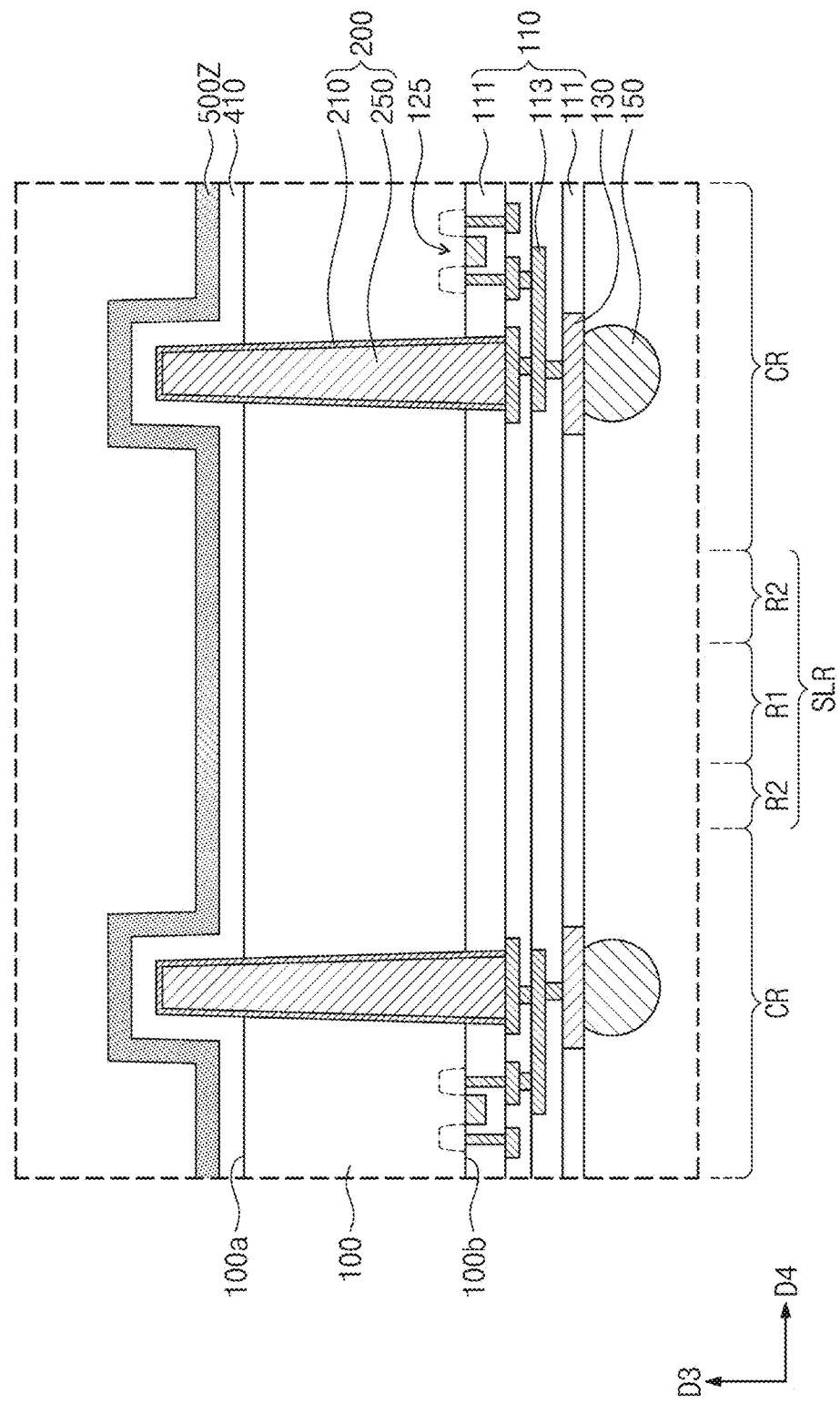

Referring to FIG. 2C, a first dielectric layer 410 may be formed on the first surface 100a of the semiconductor substrate 100 and on the upper portions of the through vias 200. The first dielectric layer 410 may conformally cover the first surface 100a of the semiconductor substrate 100, and may also conformally cover sidewalls and top surfaces of the upper portions of the through vias 200. The first dielectric layer 410 may be formed by, for example, a deposition process.

A preliminary dielectric pattern 500Z may be formed on the first surface 100a of the semiconductor substrate 100 and on the sidewalls and the top surfaces of the upper portions of the through vias 200, thereby covering the first dielectric layer 410. The preliminary dielectric pattern 500Z may be formed by a deposition process.

Figure 2D:
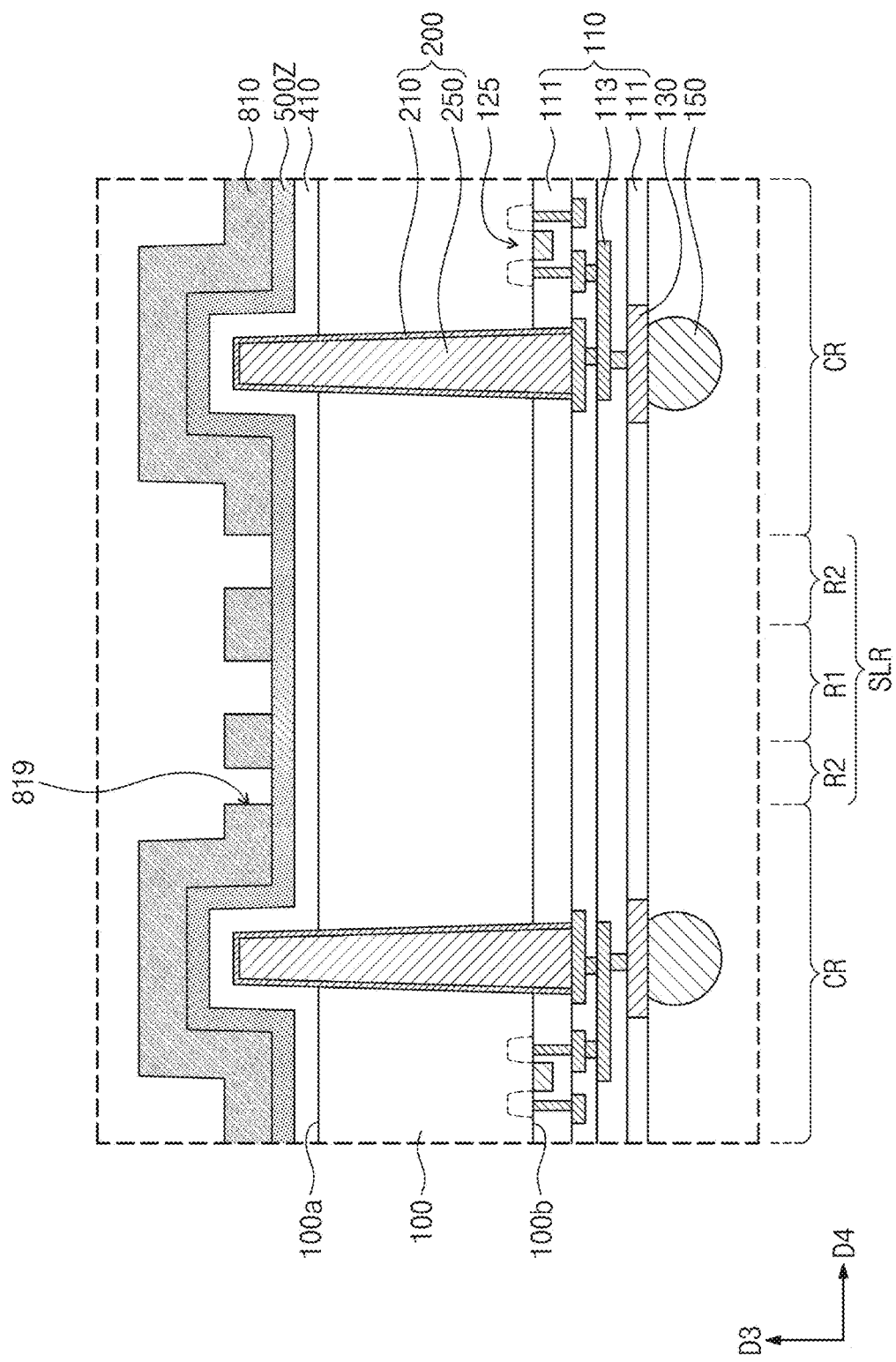

Referring to FIG. 2D, a first resist pattern 810 may be formed on the preliminary dielectric pattern 500Z. The first resist pattern 810 may include an organic material. A photolithography process may be performed such that the first resist pattern 810 may be patterned to form first guide holes 819. The first guide holes 819 may penetrate the first resist pattern 810 to expose the preliminary dielectric pattern 500Z.

Figure 2E:
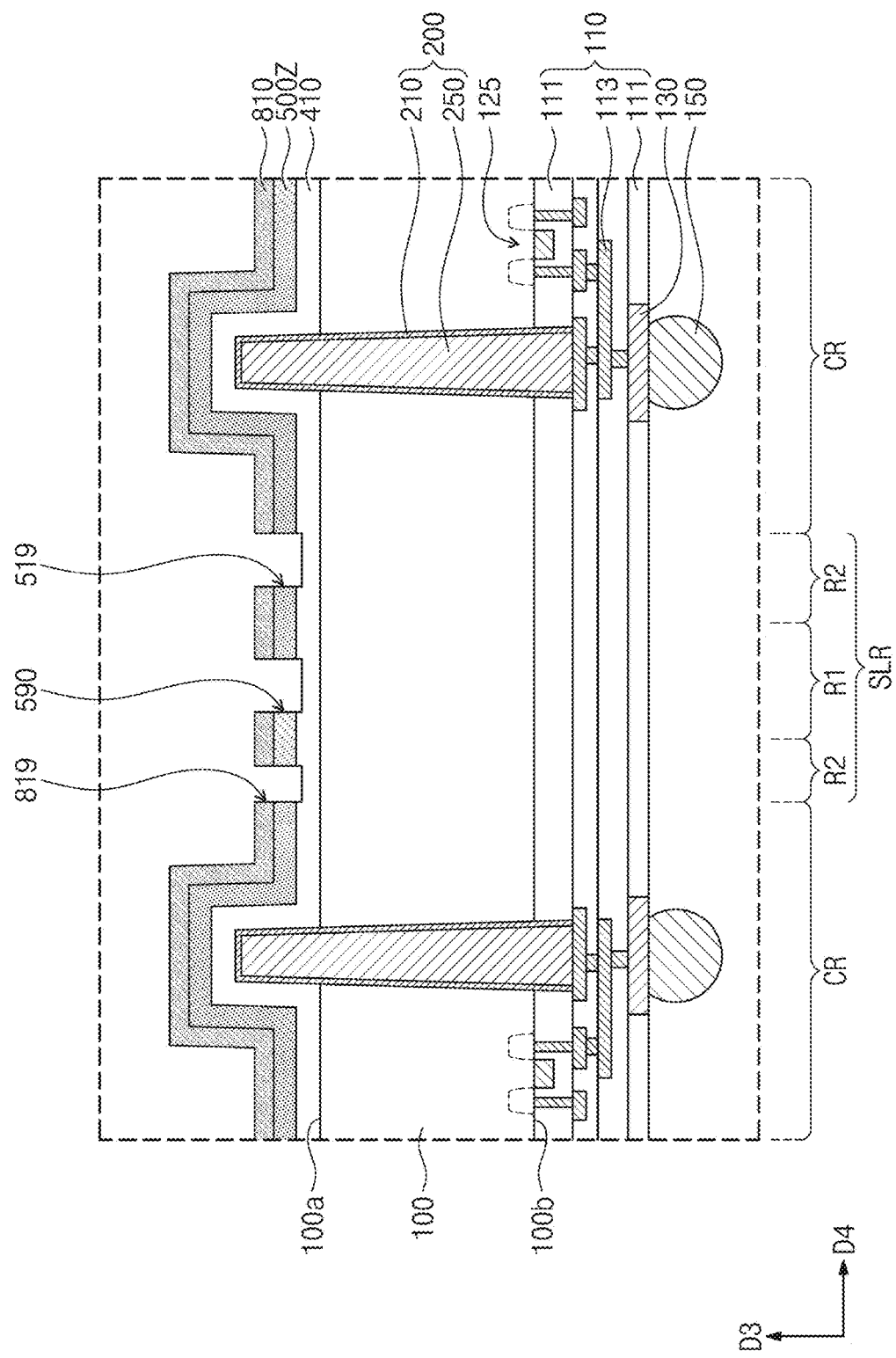

Referring to FIG. 2E, the preliminary dielectric pattern 500Z exposed to the first guide holes 819 may be removed to form a hole 590 and a trench 519. The removal of the preliminary dielectric pattern 500Z may be achieved by an etching process, such as a dry etching process. The etching process may be performed using, for example, nitrogen and oxygen. The etching process may also remove a portion of the first resist pattern 810.

The hole 590 and the trench 519 may be spaced apart from each other. The hole 590 and the trench 519 may penetrate the preliminary dielectric pattern 500Z and extend into an upper portion of the first dielectric layer 410. For example, the hole 590 and the trench 519 may have their bottom surfaces provided in the first dielectric layer 410.

Figure 2F:
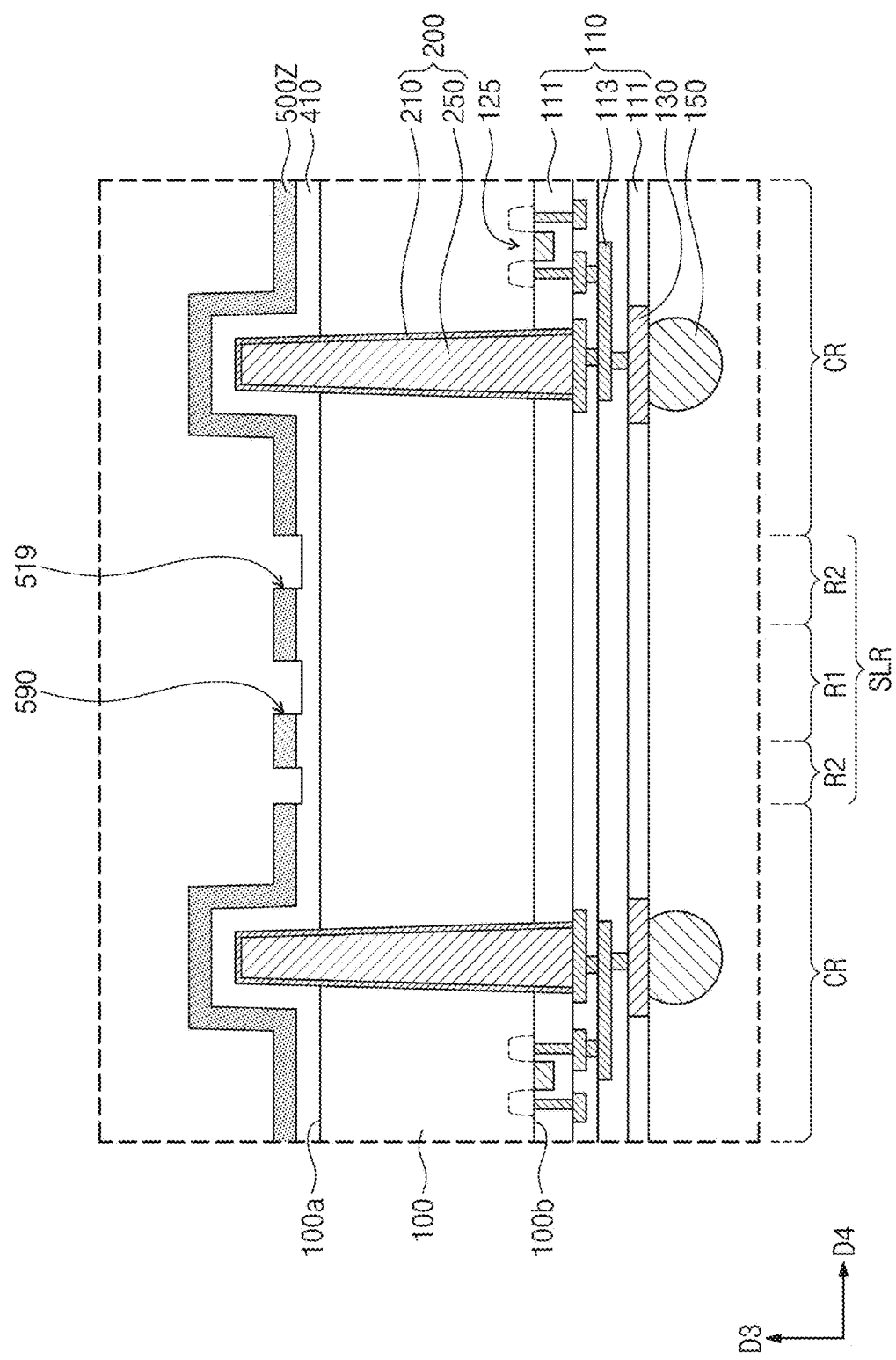

Referring to FIG. 2F, a remaining first resist pattern 810 may be removed to expose the preliminary dielectric pattern 500Z. An ashing or strip process may be performed to remove the first resist pattern 810.

Figure 2G:
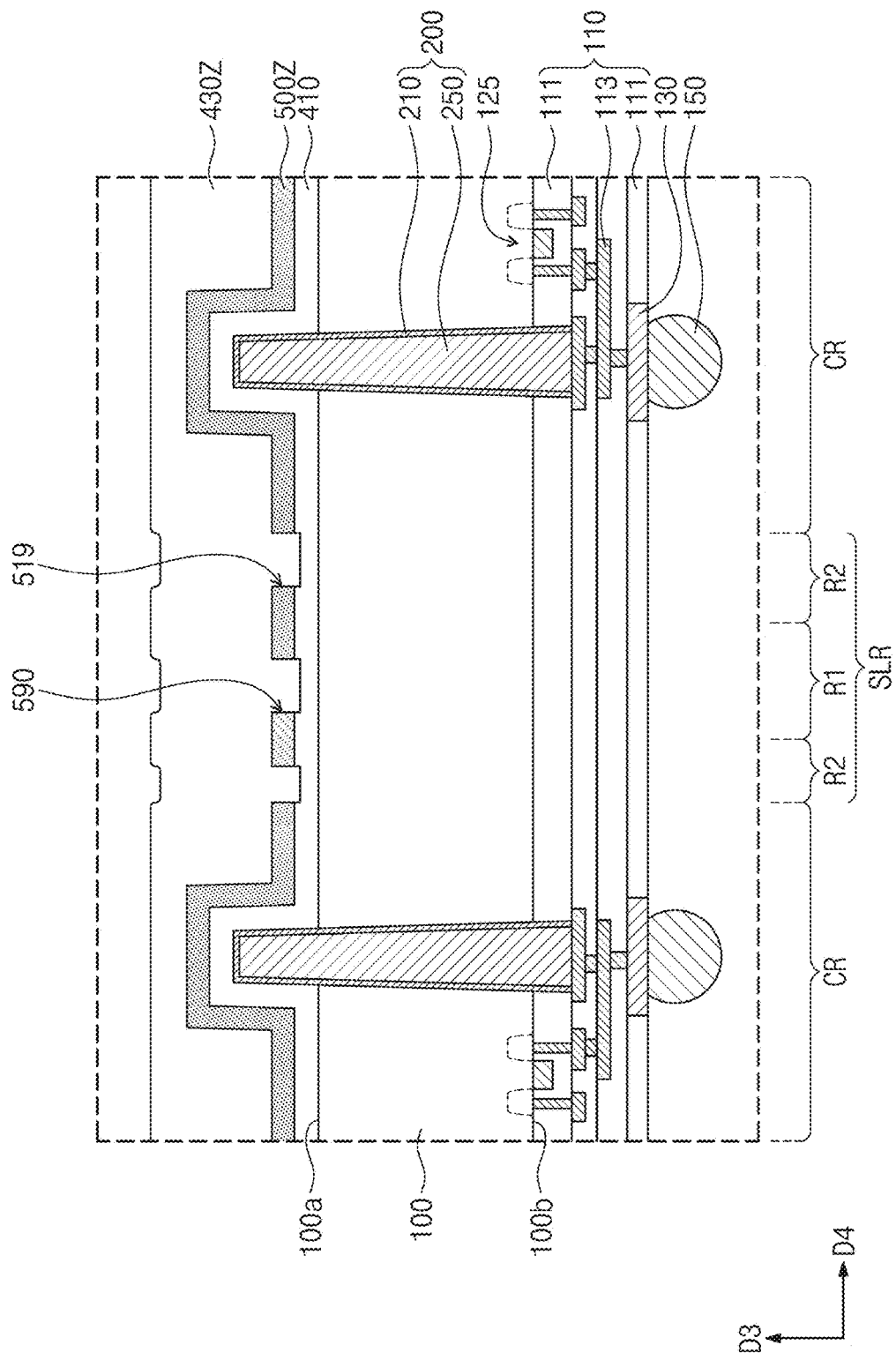

Referring to FIG. 2G, a preliminary dielectric layer 430Z may be formed on the preliminary dielectric pattern 500Z to fill the hole 590 and the trench 519. The preliminary dielectric layer 430Z may include a different material from that of the preliminary dielectric pattern 500Z. The preliminary dielectric layer 430Z in the hole 590 and the trench 519 may have a top surface located at a level the same as or higher than that of top surfaces of the through vias 200. The preliminary dielectric layer 430Z may be formed by a deposition process.

Figure 2H:
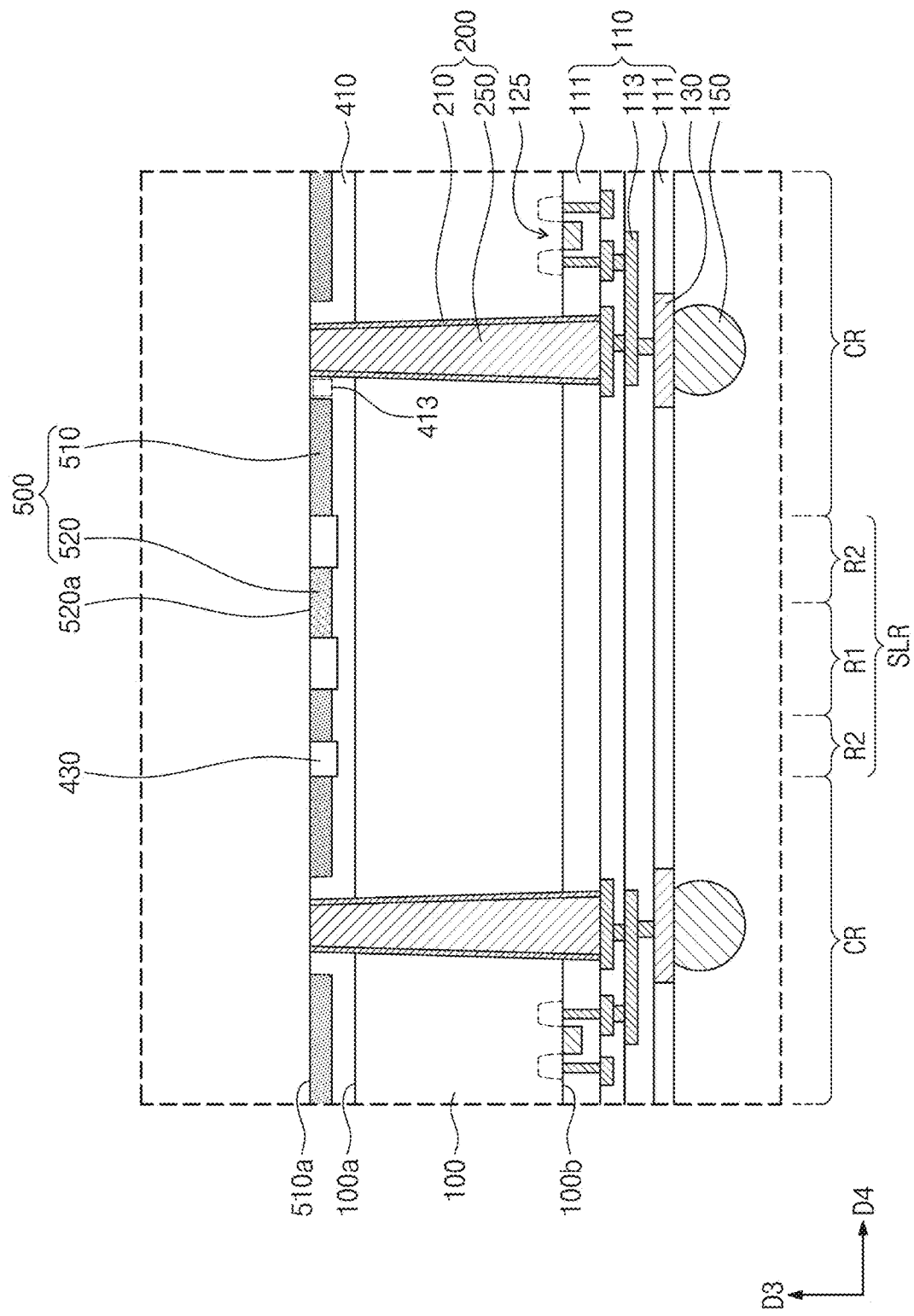

Referring to FIG. 2H, the preliminary dielectric layer 430Z may be performed to form dielectric patterns 500 and a third dielectric layer 430. The planarization process may include a chemical mechanical polishing (CMP) process. The planarization process may remove the preliminary dielectric layer 430Z from a top surface of the preliminary dielectric pattern 500Z. The preliminary dielectric layer 430Z may be localized in the hole 590 and the trench 519.

The planarization process may remove upper portions of the through vias 200, a portion of the first dielectric layer 410, and a portion of the preliminary dielectric pattern 500Z. For example, the planarization process may partially remove the first dielectric layer 410 and the preliminary dielectric pattern 500Z on the upper portion of the through vias 200. The portion of the preliminary dielectric pattern 500Z may be removed to form the dielectric patterns 500. The dielectric patterns 500 may include an alignment key pattern 520 and etch stop patterns 510. The alignment key pattern 520 and the etch stop patterns 510 510 and 520 may be separated from each other. As a result of the planarization process, there may be exposed the conductive via 250, the barrier pattern 210, the extension portions 413 of the first dielectric layer 410, the dielectric patterns 500, and the third dielectric layer 430. The dielectric patterns 500 may have their top surfaces located at substantially the same level as that of a top surface of the conductive via 250, that of a top surface of the barrier pattern, that of top surfaces of the extension portions 413 of the first dielectric layer 410, and that of a top surface of the third dielectric layer 430. The top surfaces of the dielectric patterns 500 may include a top surface 520aa of the alignment key pattern 520 and top surfaces 510a of the etch stop patterns 510.

According to some embodiments, as shown in FIG. 2G, the top surface of the preliminary dielectric layer 430Z in the hole 590 and the trench 519 is located at a level the same as or higher than that of the top surfaces of the through vias 200.

Figure 2I:
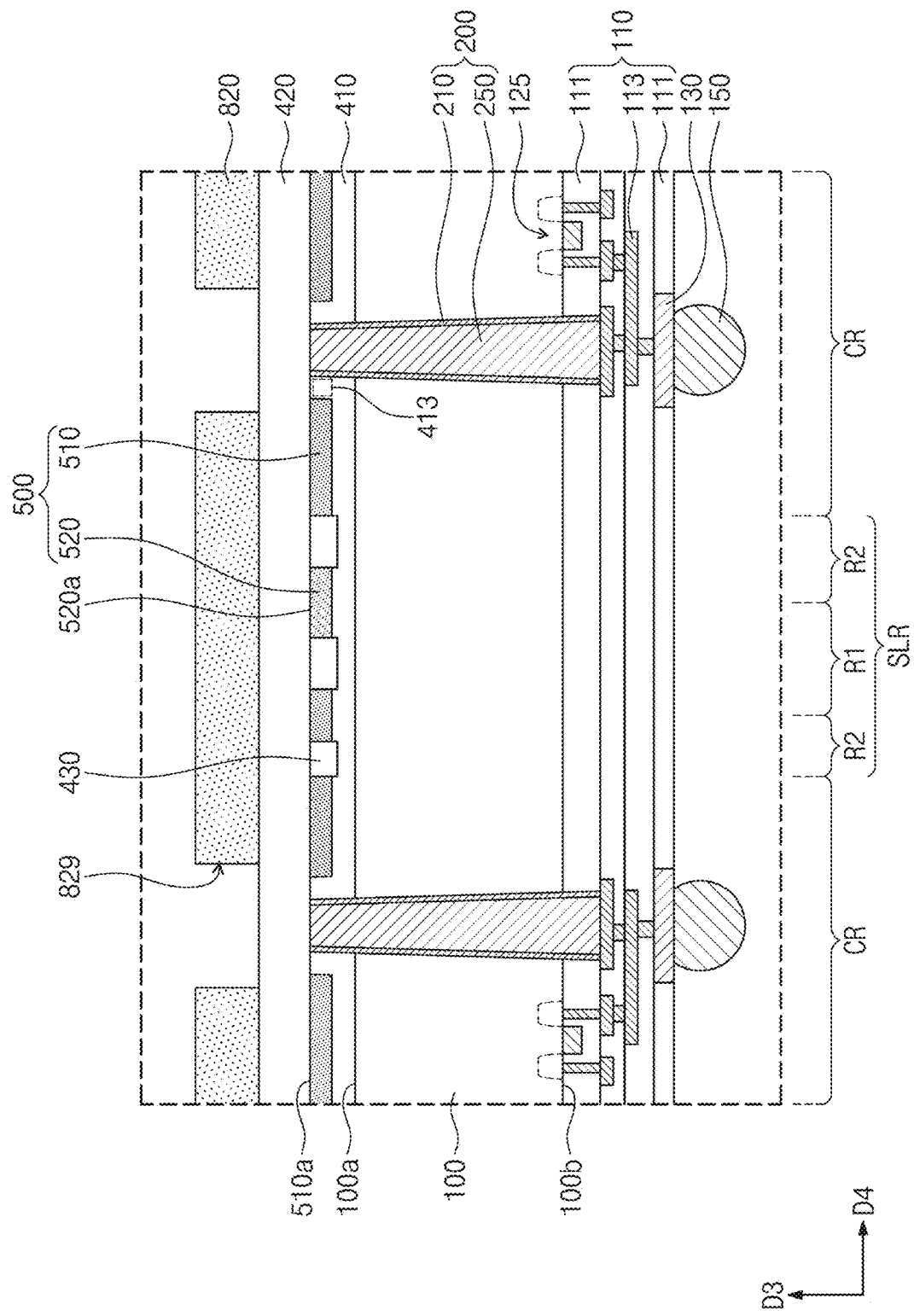

Referring to FIG. 2I, a second dielectric layer 420 may be formed to cover the top surfaces of the through vias 200, the top surfaces of the extension portions 413 of the first dielectric layer 410, the top surfaces of the dielectric patterns 500, and the top surface of the third dielectric layer 430. The second dielectric layer 420 may have a flat top surface. The second dielectric layer 420 may be formed by a deposition process.

A second resist pattern 820 may be formed on the second dielectric layer 420. A photolithography process may be performed such that the second resist pattern 820 may be patterned to form second guide holes 829. The second guide holes 829 may penetrate the second resist pattern 820 and expose the second dielectric layer 420.

Before the second guide holes 829 are formed, a position of the alignment key pattern 520 may be recognized. According to some embodiments, because the alignment key pattern 520 includes the first, second, and third dielectric layers 410, 420, and 430, there may be a visible interface between the alignment key pattern 520 and the first, second, and third dielectric layers 410, 420, and 430. Light (e.g., infrared light) may be used to recognize the alignment key pattern 520. The light may pass through the second resist pattern 820 and the second dielectric layer 420. The recognized position of the alignment key pattern 520 may be used to calculate positions of the through vias 200. The recognized and calculated results may be used to decide formation positions of the second guide holes 829. The second guide holes 829 may vertically overlap the through vias 200.

Figure 2J:
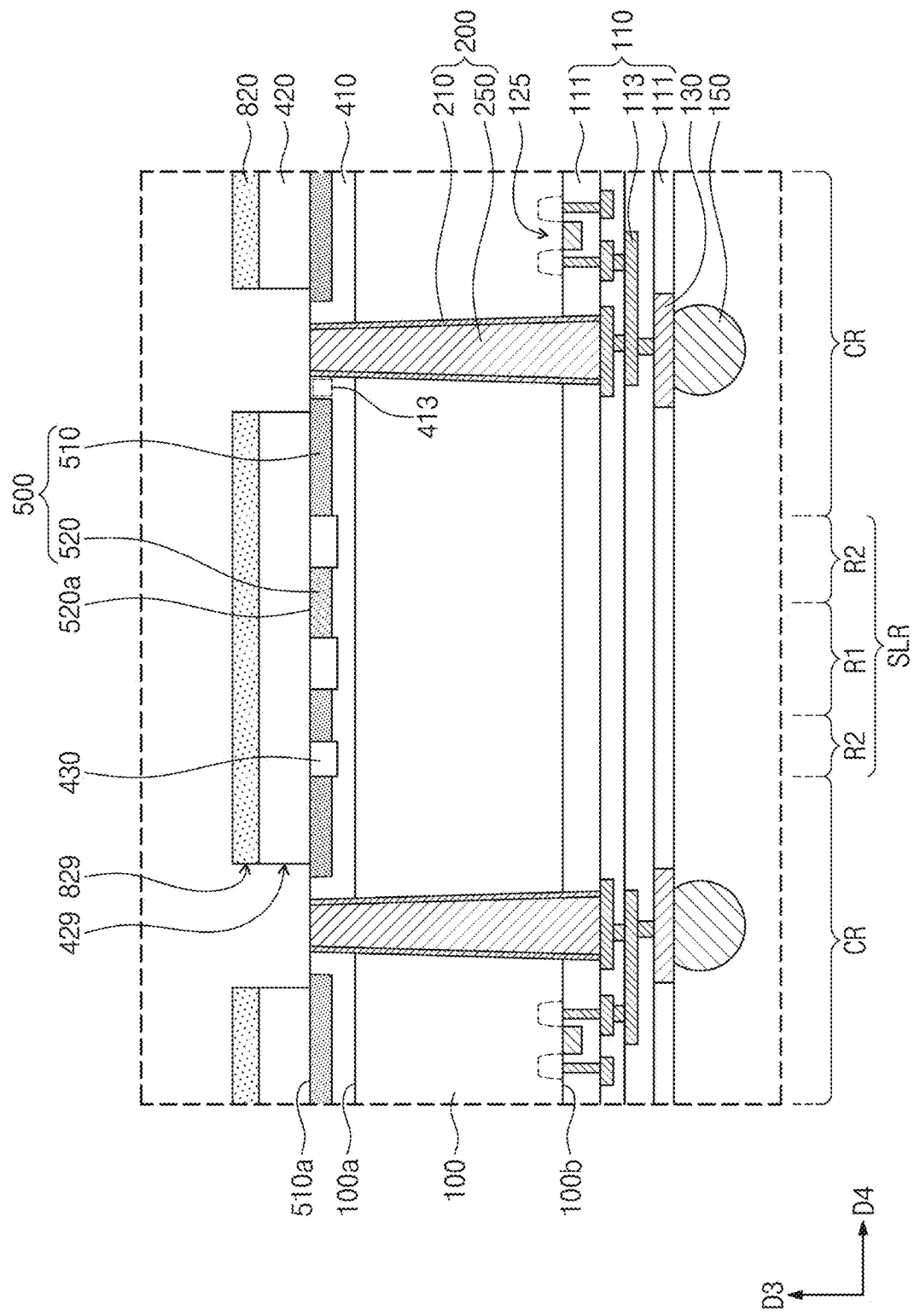

Referring to FIG. 2J, the second dielectric layer 420 exposed to the second guide holes 829 may be etched to form pad trenches 429 in the second dielectric layer 420. A dry etching process may be performed to etch the second dielectric layer 420. For example, oxygen may be used to perform the dry etching process. In the etching process, an upper portion of the second resist pattern 820 may be removed.

In the etching process, the etch stop patterns 510 and the through vias 200 may have their etch selectivity. For example, the etch stop patterns 510 may not be etched or may have an extremely low etch rate. After the etching process is completed, the pad trenches 429 may expose the top surfaces 510a of the etch stop patterns 510 and the top surfaces of the through vias 200. In addition, the pad trenches 429 may expose the extension portions 413 of the first dielectric layer 410. When the etch stop patterns 510 are omitted, the pad trenches 429 may have step differences on bottom surfaces thereof. According to some embodiments, the etch stop patterns 510 may be provided to satisfactorily form the pad trenches 429.

Alternatively, in the etching process, the extension portions 413 of the first dielectric layer 410 may further be etched. In this case, the top surfaces of the extension portions 413 of the first dielectric layer 410 may be located at a lower level than that of the top surfaces 510a of the etch stop patterns 510.

Figure 2K:
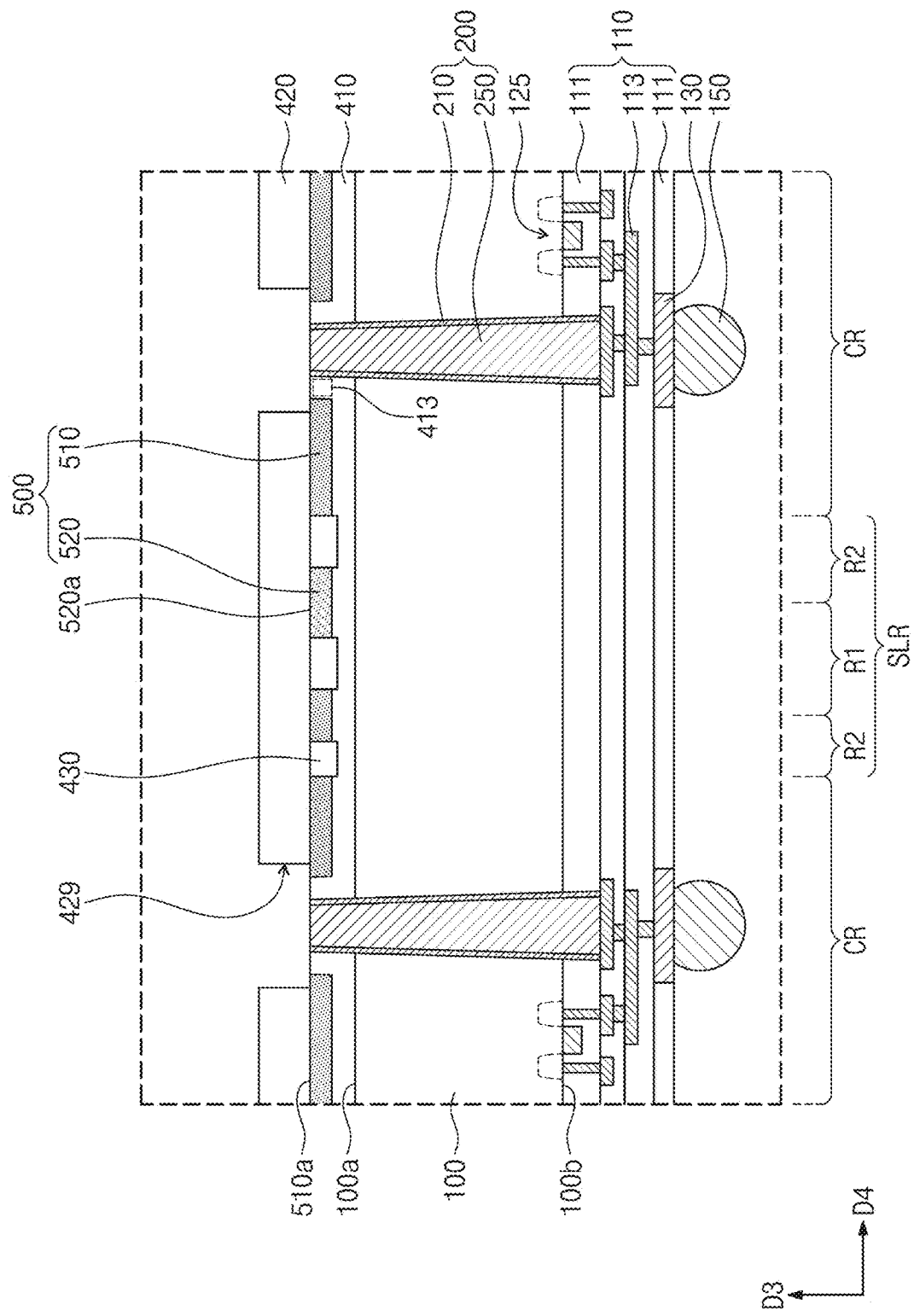

Referring to FIG. 2K, the second resist pattern 820 may be removed to expose a top surface of the second dielectric layer 420. An ashing or strip process may be performed to remove the second resist pattern 820.

Figure 2L:
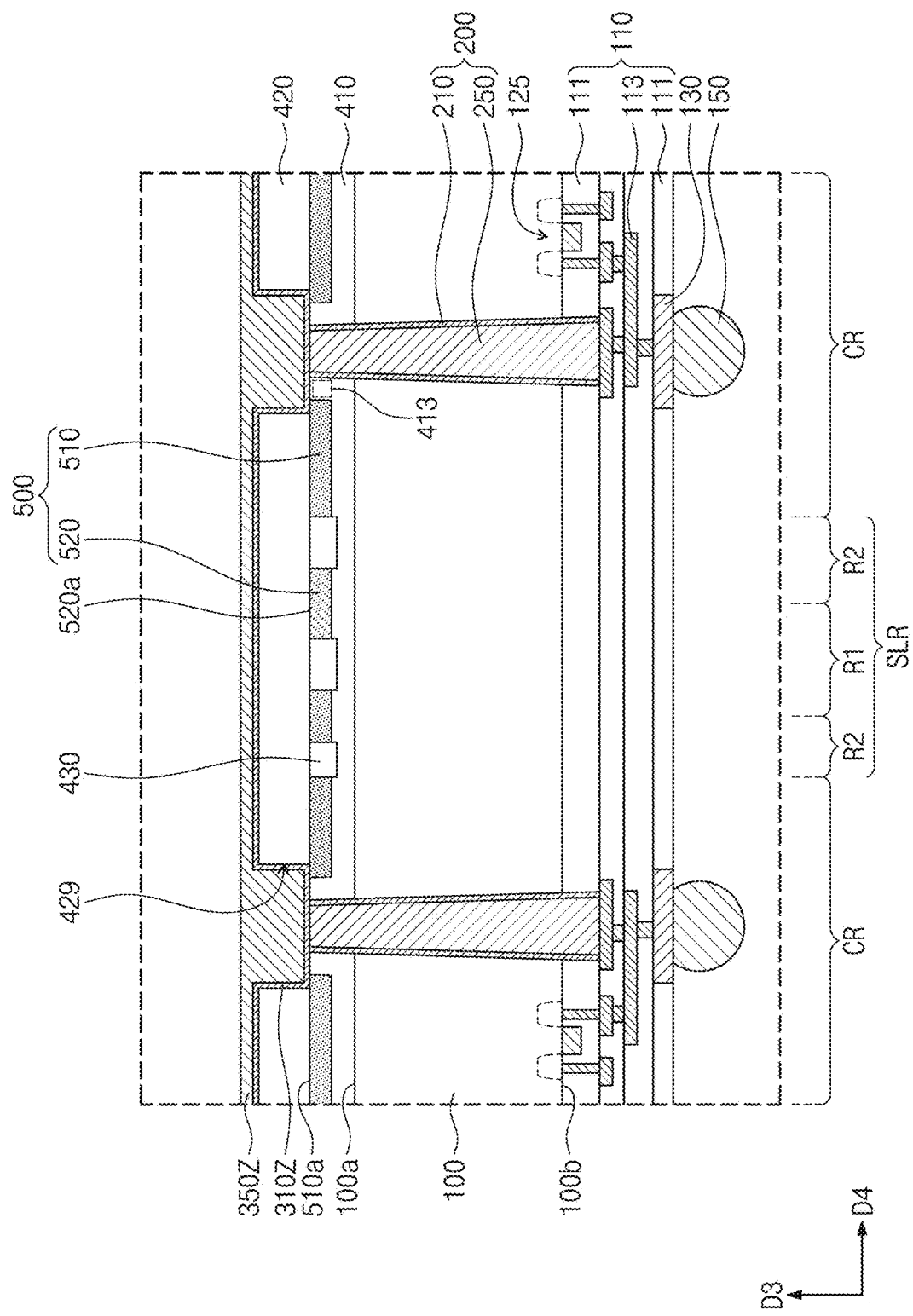

Referring to FIG. 2L, a barrier layer 310Z may be formed in the pad trenches 429 and on the second dielectric layer 420. A deposition process may be performed to form the barrier layer 310Z. The barrier layer 310Z may conformally cover the bottom surfaces and sidewalls of the pad trenches 429 and the top surface of the second dielectric layer 420.

An electroplating process may be performed in which the barrier layer 310Z is used as an electrode. The electroplating process may fill the pad trenches 429 with metal to form a metal layer 350Z. The metal layer 350Z may extend onto the top surface of the second dielectric layer 420.

Referring back to FIG. 1D, the metal layer 350Z and the barrier layer 310Z may undergo a polishing process to form a metal pad 350 and a barrier pad 310. The polishing process may include a chemical mechanical polishing (CMP) process. The polishing process may partially remove the barrier layer 310Z and the metal layer 350Z that are provided on the top surface of the second dielectric layer 420. As a result of the polishing process, conductive pads 300 may be formed which are separated from each other. The conductive pads 300 may be localized in the pad trenches 429. Each of the conductive pads 300 may include a metal pad 350 and a barrier pad 310. The conductive pads 300 may have their top surfaces 300a coplanar with a first top surface 420a of the second dielectric layer 420.

The second dielectric layer 420 on the scribe lane region SLR may be relatively widely spaced apart from the conductive pads 300. In the polishing process, the second dielectric layer 420 on the scribe lane region SLR may further be partially removed. Therefore, the second dielectric layer 420 may have a second top surface 420aa on the scribe lane region SLR. The second top surface 420aa may be located at a lower level than that of top surfaces 300a of the conductive pads 300.

The processes mentioned above may eventually fabricate a wafer structure 1000 discussed in the embodiments of FIGS. 1A to 1D.

The following will describe a semiconductor device and a dicing process that is performed on a wafer structure according to some embodiments.

Figure 3A:
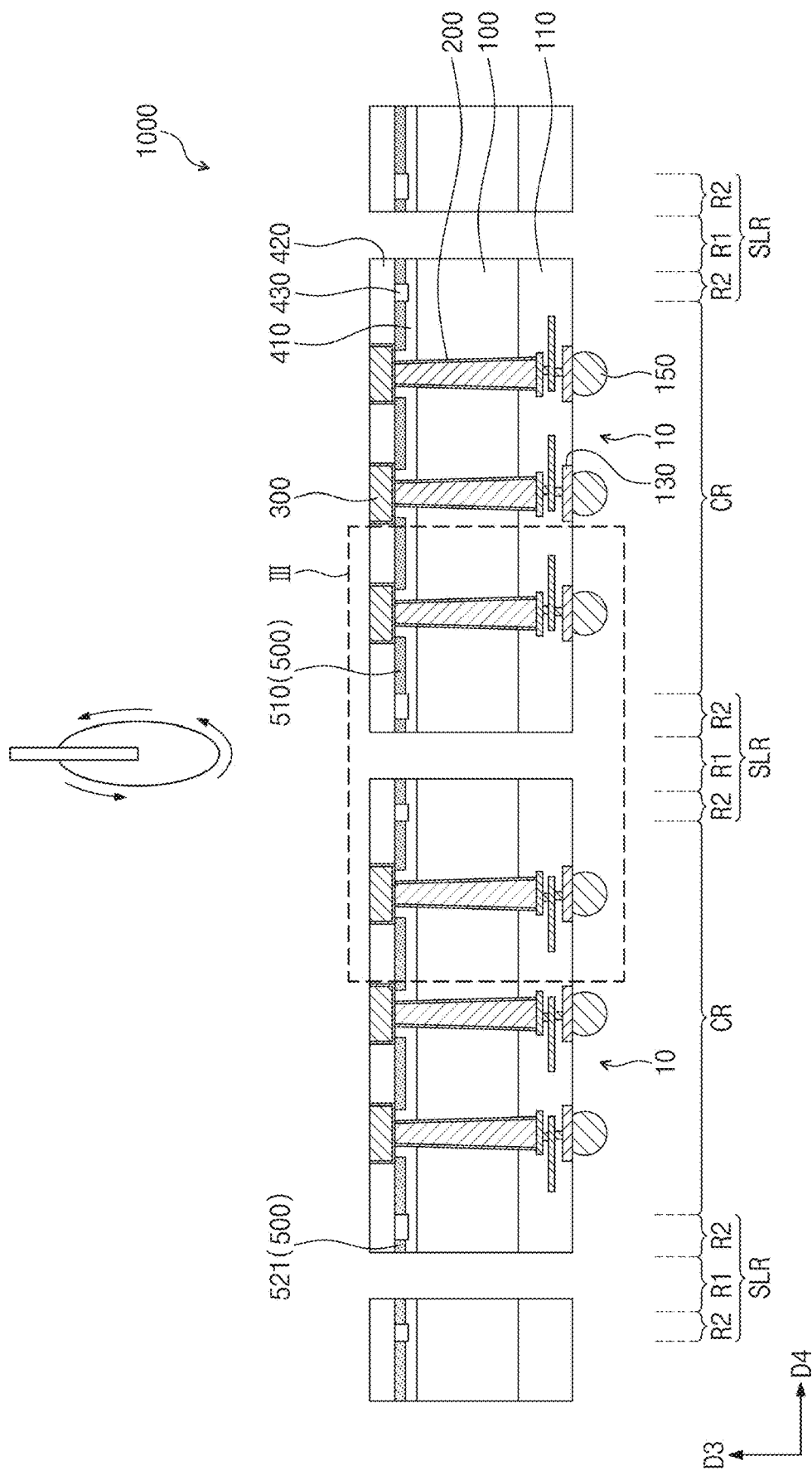
FIG. 3A illustrates a cross-sectional view showing a dicing process performed on a wafer structure according to some embodiments.
Figure 3B:
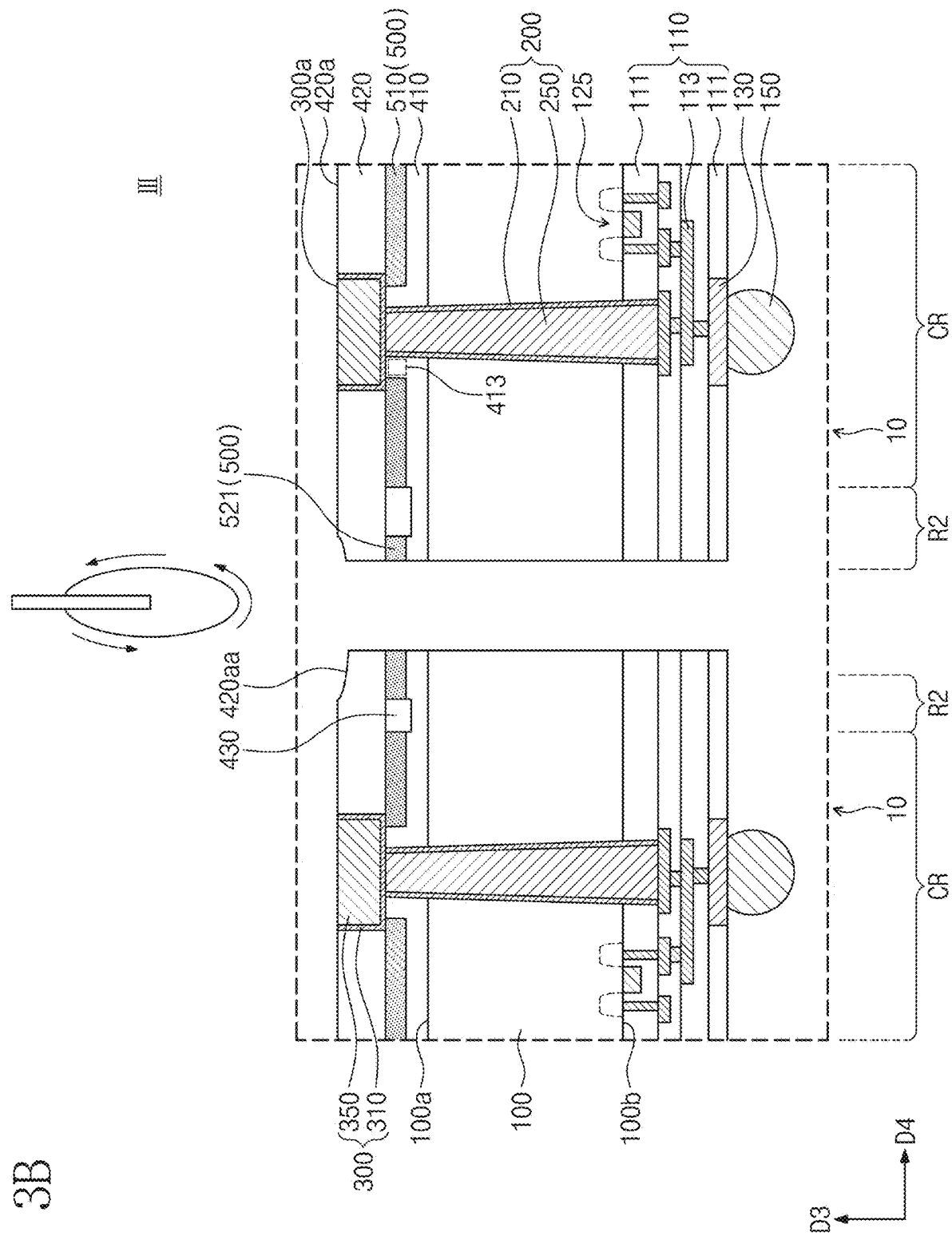
FIG. 3B illustrates an enlarged view showing section III of FIG. 3A.
Figure 3C:
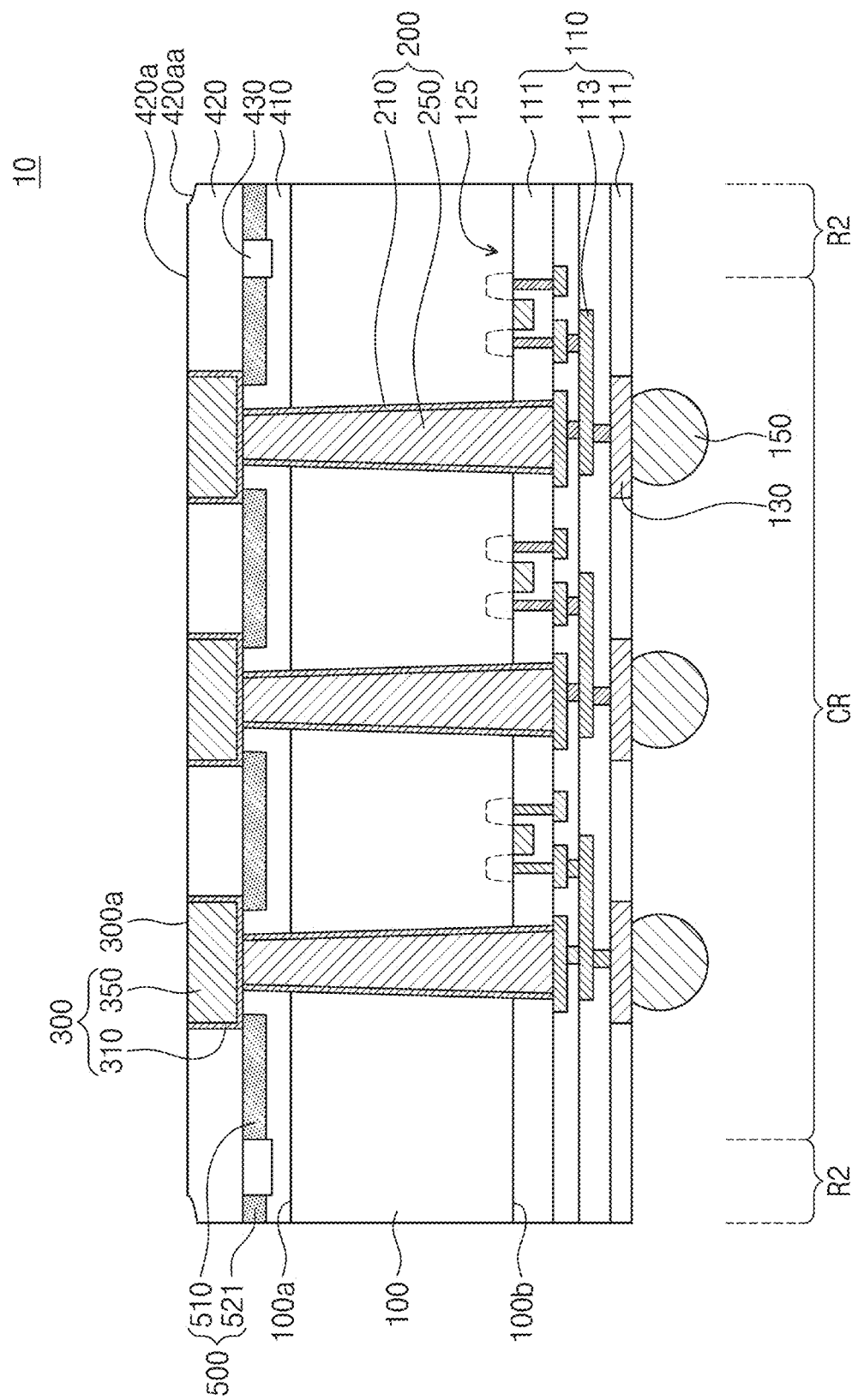
FIG. 3C illustrates a cross-sectional view showing a semiconductor device fabricated according to some embodiments.

FIG. 3A illustrates a cross-sectional view taken along line II-II' of FIG. 1B, showing a dicing process performed on a wafer structure according to some embodiments. FIG. 3B illustrates an enlarged view showing section III of FIG. 3A. FIG. 3C illustrates a cross-sectional view showing a semiconductor device fabricated according to some embodiments.

Referring back to FIG. 1C, a wafer structure 1000 may be prepared. As discussed above, the wafer structure 1000 may include the semiconductor substrate 100, the solder balls 150, the circuit layer 110, the through vias 200, the conductive pads 300, the first, second, and third dielectric layers 410, 420, and 430, the etch stop patterns 510, and the alignment key pattern 520.

Referring to FIGS. 3A to 3C, a dicing process may be performed such that the semiconductor substrate 100, the circuit layer 110, the first dielectric layer 410, the second dielectric layer 420, and the alignment key pattern 520 may be diced along the dicing region R1 of the scribe lane region SLR. The dicing process may be executed by using a mechanical tool, such as a blade. Therefore, the dicing process may remove the semiconductor substrate 100, the circuit layer 110, the first dielectric layer 410, the second dielectric layer 420, and the alignment key pattern 520 that are formed on the dicing region R1. The presence of the dummy region R2 may prevent or mitigate damage to components of the chip region CR in the dicing process. For example, it may be possible to prevent or mitigate damage to the integrated circuits 125, the through vias 200, the conductive pads 300, the wiring structures 113, and the lower conductive pads 130.

As a result of the dicing process, semiconductor devices 10 may be formed which are separated from each other. As shown in FIG. 1C, each of the semiconductor devices 10 may include one of the chip regions CR of the semiconductor substrate 100. Each of the semiconductor devices 10 may include the circuit layer 110, the solder balls 150, the through vias 200, the conductive pads 300, the first, second, and third dielectric layers 410, 420, and 430, and the etch stop pattern 510 that correspond to the chip region CR. In addition, each of the semiconductor devices 10 may include a corresponding dummy region R2, and may also include the circuit layer 110 and the first, second, and third dielectric layers 410, 420, and 430 on the dummy region R2. After the dicing process, a portion of the alignment key pattern 520 may remain on the dummy region R2 to form a dummy dielectric pattern 521. The dummy dielectric pattern 521 may be a dummy alignment key pattern. A portion of the dummy dielectric pattern 521 may be exposed, or not covered by the dielectric layers 410, 420, and 430, on a sidewall of the semiconductor device 10. The sidewall of the semiconductor device 10 may be a cutting surface. The first and second dielectric layers 410 and 420 may have their sidewalls that expose a sidewall of the alignment key pattern 520. When viewed in plan, the dummy region R2 of the semiconductor substrate 100 may correspond to an edge region of the semiconductor device 10. The chip region CR may surround the dummy region R2 of the semiconductor substrate 100.

At least a portion of the second top surface 420aa of the second dielectric layer 420 may remain on the dummy region R2. A level difference between the top surfaces 300a of the conductive pads 300 and the second top surface 420aa of the second dielectric layer 420 on the dummy region R2 may be less than the level difference A between the top surfaces 300a of the conductive pads 300 and the second surface 100b of the second dielectric layer 420 discussed in FIG. 1C.

When the alignment key pattern 520 includes metal, a metal residue may be formed after the dicing process. It may be difficult to remove the metal residue. According to some embodiments, because the alignment key pattern 520 includes a silicon-based dielectric material, and because no conductive component is provided on the scribe lane region SLR, there may be no occurrence of metal residue. Therefore, the semiconductor devices 10 may be fabricated in high yield and may have increased reliability.

When the alignment key pattern 520 includes metal, a dicing tool may be damaged. According to some embodiments, the alignment key pattern 520 may have strength less than that of metal. Therefore, the dicing tool may be prevented or reduced from damage.

Through the processes mentioned above, the semiconductor device 10 may be eventually fabricated. The semiconductor device 10 may be a semiconductor chip.

The following will describe a bonding process and a semiconductor package fabrication method according to some embodiments.

Figure 4A:
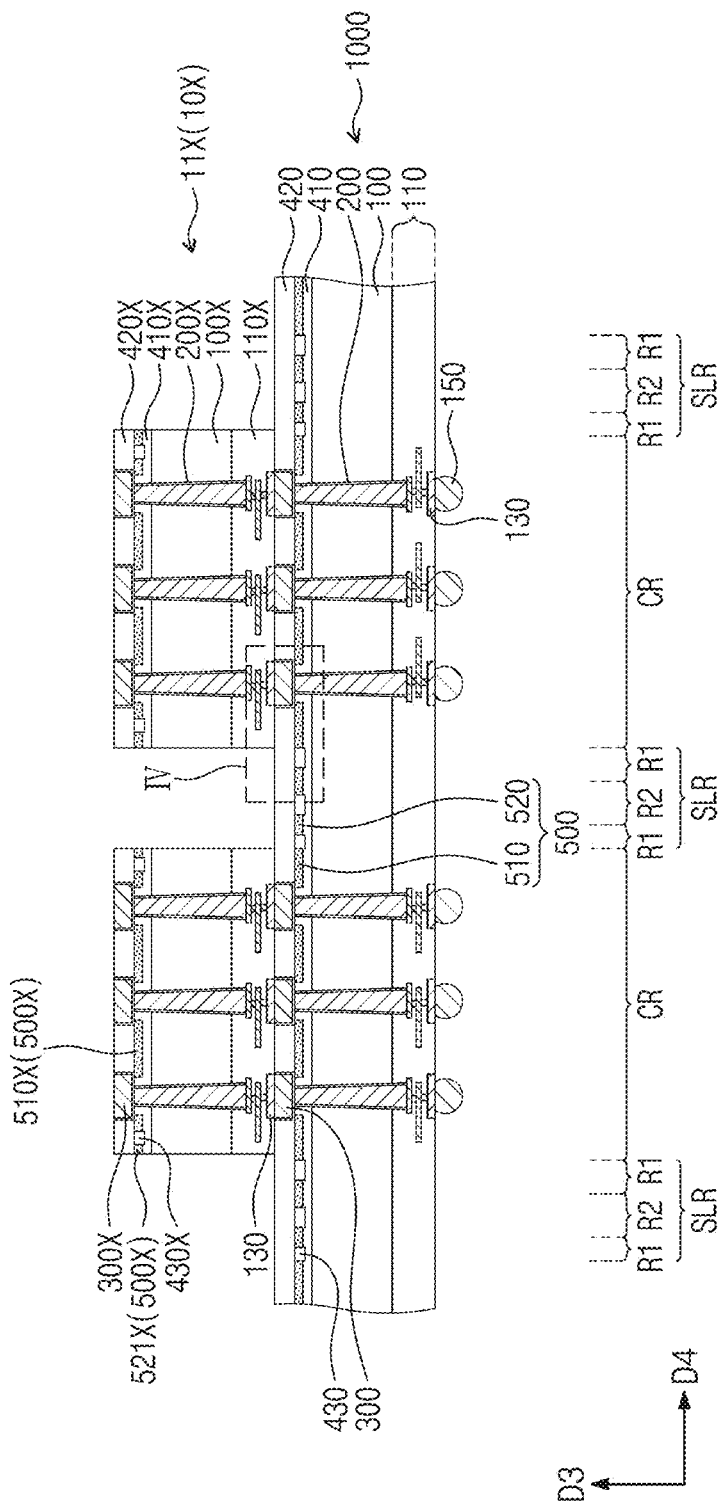
FIGS. 4A, 4D, 4F, and 4G illustrate cross-sectional views showing a method of fabricating a semiconductor device according to some embodiments.
Figure 4B:
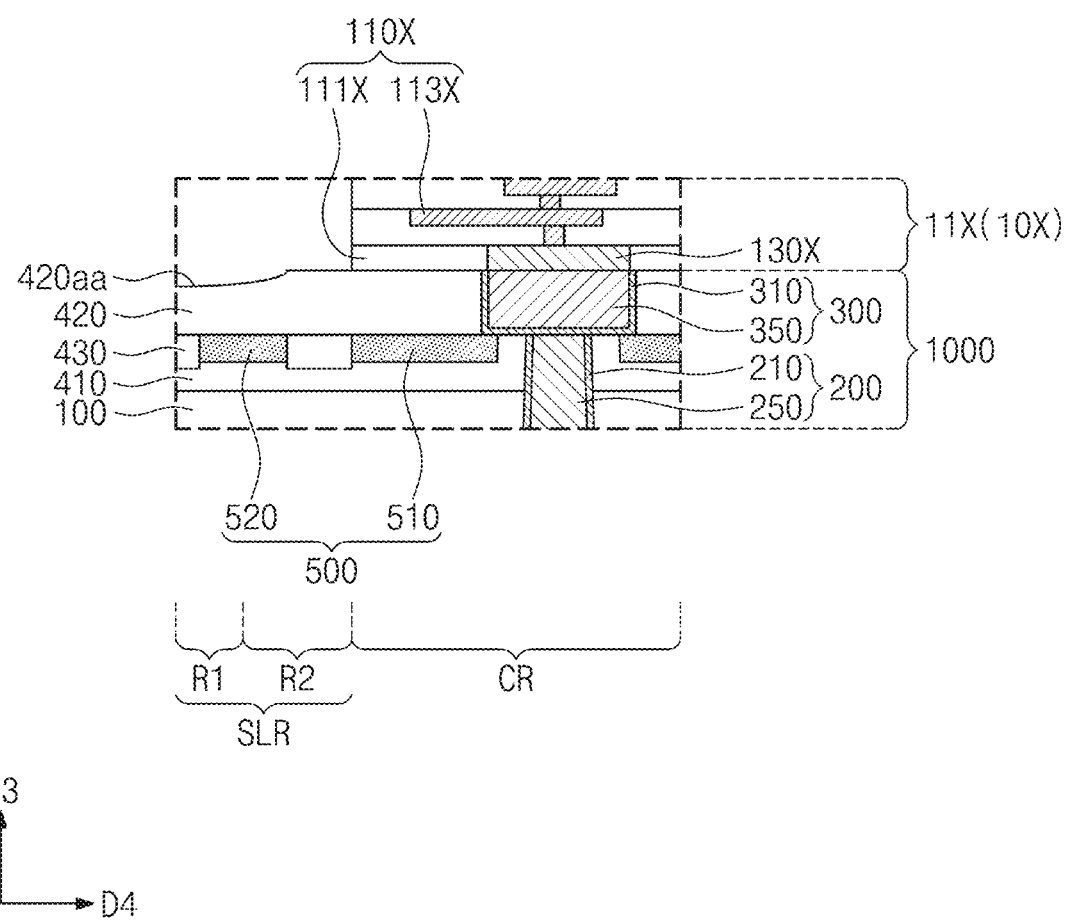
FIGS. 4B and 4C illustrate an enlarged view showing section IV of FIG. 4A.

FIGS. 4A, 4B, 4D, 4F, and 4G illustrate cross-sectional views showing a method of fabricating a semiconductor device according to some embodiments. FIG. 4B illustrates an enlarged view showing section IV of FIG. 4A. FIG. 4E illustrates an enlarged view showing section V of FIG. 4D.

Figure 4C:
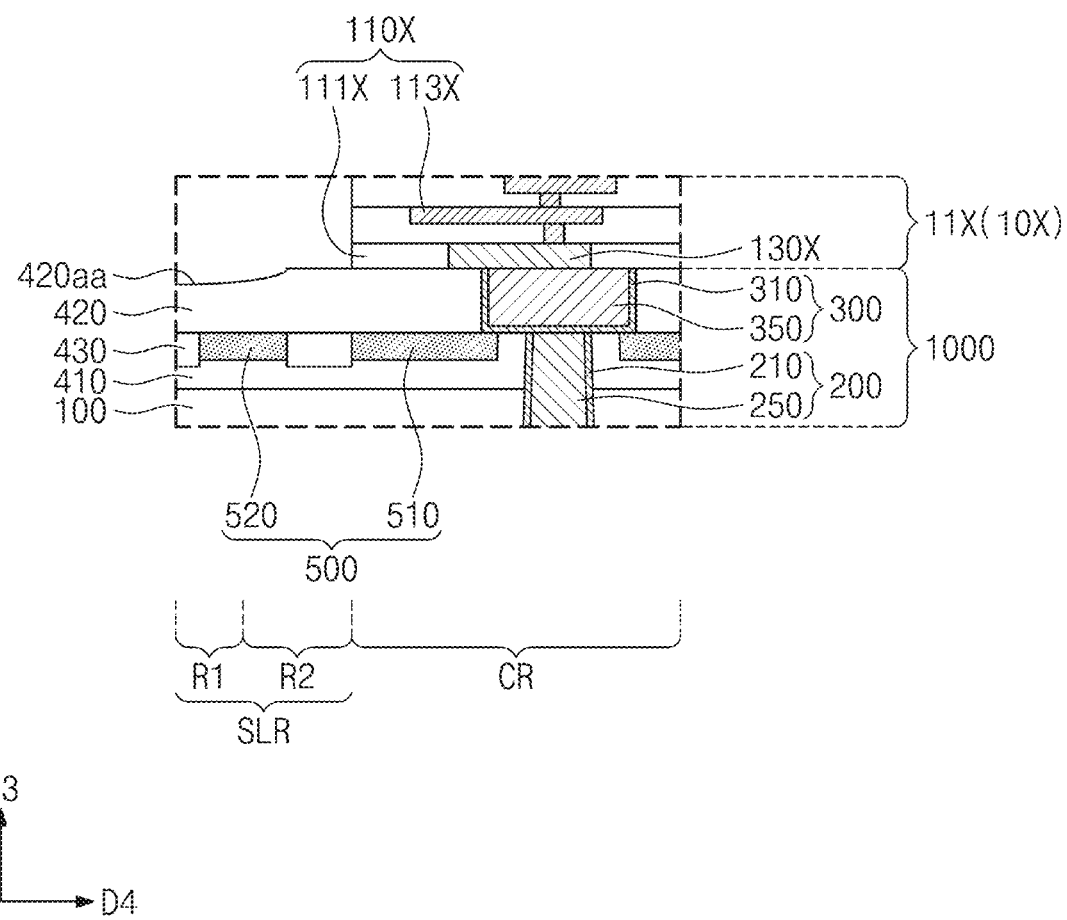

Referring to FIGS. 4A to 4C, semiconductor chips 10X may be bonded to a top surface of the wafer structure 1000. The wafer structure 1000 may be first prepared. The wafer structure 1000 may be substantially the same as that discussed with reference to FIGS. 1A to 1D. For example, the wafer structure 1000 may include a substrate, the circuit layer 110, the lower conductive pads 130, the through vias 200, the conductive pads 300, the first, second, and third dielectric layers 410, 420, and 430, and the dielectric patterns 500. The dielectric patterns 500 may include the alignment key pattern 520 and the etch stop patterns 510.

As discussed in the embodiments of FIGS. 3A and 3B, the semiconductor chips 10X may be the semiconductor devices 10 formed by dicing the wafer structure 1000. Each of the semiconductor chips 10X may include a first semiconductor substrate 100X, a first circuit layer 110X, first lower conductive pads 130X, first through vias 200X, first conductive pads 300X, a first upper dielectric layer 410X, a second upper dielectric layer 420X, a third upper dielectric layer 430X, and first dielectric patterns 500X. The first semiconductor substrate 100X, the first circuit layer 110X, the first lower conductive pads 130X, the first through vias 200X, the first conductive pads 300X, the first upper dielectric layer 410X, the second upper dielectric layer 420X, the third upper dielectric layer 430X, and the first dielectric patterns 500X may be correspondingly substantially the same as the semiconductor substrate 100, the circuit layer 110, the lower conductive pads 130, the through vias 200, the conductive pads 300, the first dielectric layer 410, the second dielectric layer 420, the third dielectric layer 430, and the dielectric patterns 500 discussed in the embodiments of FIGS. 3B and 3C. The first dielectric patterns 500X may include a first dummy dielectric pattern 521X and a first etch stop pattern 510X. The first dummy dielectric pattern 521X and the first etch stop pattern 510X may be respectively the same as the dummy dielectric pattern 521 and the etch stop pattern 510 discussed in the embodiments of FIGS. 3B and 3C. The semiconductor chips 10X may not include the solder balls 150. The semiconductor chips 10X may be first semiconductor chips 11X.

The first semiconductor chips 11X may be disposed and bonded. According to some embodiments, the first semiconductor chips 11X may be directly disposed on corresponding chip regions CR at the top surface of the wafer structure 1000. The first semiconductor chips 11X and the wafer structure 1000 may be provided with heat or pressure to perform a bonding process of the first semiconductor chips 11X. Therefore, the first semiconductor chips 11X and the wafer structure 1000 may be connected in a direct bonding mode. For example, the conductive pads 300 of the wafer structure 1000 may be directly bonded to the first lower conductive pads 130X of the first semiconductor chips 11X. The first lower conductive pads 130X may be vertically aligned with the conductive pads 300. The heat or pressure may induce diffusion of metal elements between the conductive pads 300 and the first lower conductive pads 130X such that indistinct interfaces may be provided between the conductive pads 300 and the first lower conductive pads 130X, but the present inventive concepts are not limited thereto. The first circuit layer 110X of each of the first semiconductor chips 11X may be directly bonded to the second dielectric layer 420 of the wafer structure 1000. For example, the first circuit layer 110X may include first dielectric layers 111X and first wiring structures 113X. The first dielectric layers 111X and the first wiring structures 113X may be substantially the same as the dielectric layers 111 and the wiring structures 113 discussed in FIG. 1C. A lowermost first dielectric layer 111X may be directly bonded to the second dielectric layer 420. A chemical bond may be formed between a bottom surface of the lowermost first dielectric layer 111X and the first top surface 420a of the second dielectric layer 420. The chemical bond may include a covalent bond. The second top surface 420aa of the second dielectric layer 420 may be located at a lower level than that of the first top surface 420a of the second dielectric layer 420, and may be spaced apart from the semiconductor chips 10X.

FIG. 4C illustrates an enlarged cross-sectional view of section IV depicted in FIG. 4A, showing a direct bonding between a semiconductor chip and a wafer structure according to some embodiments. The following description of FIG. 4C will focus on a single semiconductor chip, a single conductive pad, and a single first lower conductive pad.

Referring to FIG. 4C, the first semiconductor chip 11X and the wafer structure 1000 may be directly bonded to each other. The first lower conductive pad 130X may not be vertically aligned with the conductive pad 300. For example, the first lower conductive pad 130X may be offset in a horizontal direction from the conductive pad 300. The first lower conductive pad 130X may have an edge region whose bottom surface is in direct contact with the second dielectric layer 420.

Referring back to FIG. 4A, when the first semiconductor chips 11X include metal residues, a poor bonding may be provided between the first semiconductor chips 11X and the wafer structure 1000. For example, the metal residues may cause the occurrence of voids between the first semiconductor chips 11X and the wafer structure 1000 or the first semiconductor chips 11X may be delaminated from the wafer structure 1000. According to some embodiments, as discussed in FIGS. 3A and 3B, because the dummy dielectric pattern 521 includes a silicon-based dielectric material, and because no conductive component is provided on the scribe lane region SLR, there may be no occurrence of metal residue. Therefore, the first semiconductor chips 11X may be satisfactorily bonded to the wafer structure 1000.

Figure 4D:
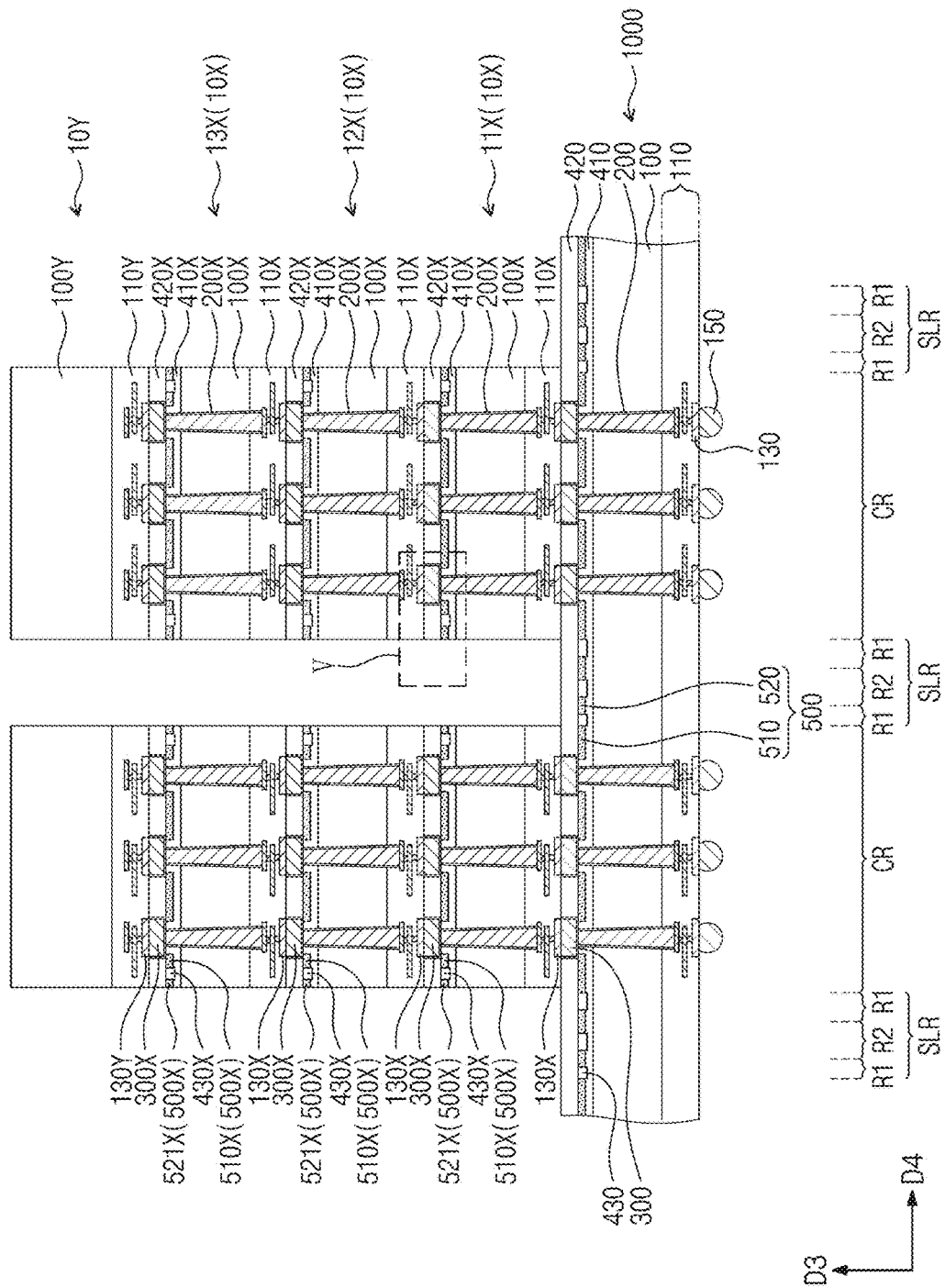
Figure 4E:
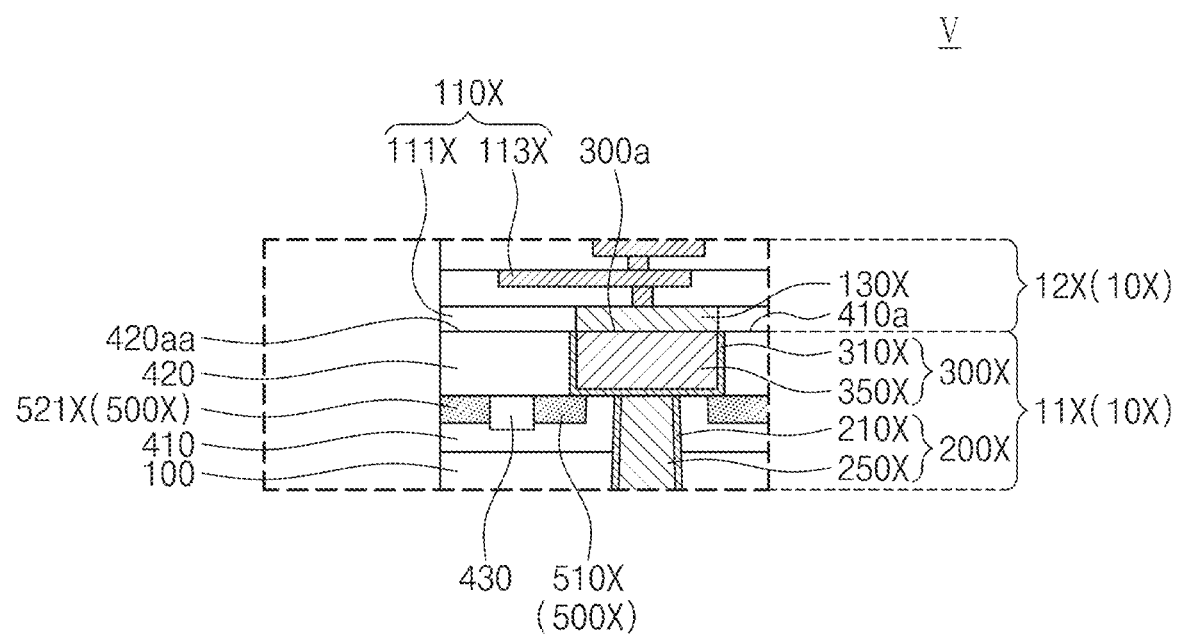
FIG. 4E illustrates an enlarged view showing section V of FIG. 4D.

Referring to FIGS. 4D and 4E, the placement and bonding of the semiconductor chips 10X may be repeatedly performed. The placement and bonding of the semiconductor chips 10X may be performed by substantially the same method as that discussed in the embodiments of FIGS. 4A and 4B.

According to some embodiments, the semiconductor chips 10X may include first semiconductor chips 11X and second semiconductor chips 12X. The second semiconductor chips 12X may have their components substantially the same as those of the first semiconductor chips 11X. Each of the second semiconductor chips 12X may include the first semiconductor substrate 100X, the first circuit layer 110X, the first lower conductive pads 130X, the first through vias 200X, the first conductive pads 300X, the first upper dielectric layer 410X, the second upper dielectric layer 420X, the third upper dielectric layer 430X, and the first dielectric patterns 500X.

The second semiconductor chips 12X may be directly disposed on the first semiconductor chips 11X. The first semiconductor chips 11X and the second semiconductor chips 12X may be provided with heat or pressure to perform a bonding process of the second semiconductor chips 12X. Therefore, the first semiconductor chips 11X and the second semiconductor chips 12X may be connected in a direct bonding mode. For example, as shown in FIG. 4E, the first conductive pads 300X of the first semiconductor chips 11X may be directly bonded to the first lower conductive pads 130X of the second semiconductor chips 12X. The first conductive pads 300X of the first semiconductor chips 11X may be vertically aligned with the first lower conductive pads 130X of the second semiconductor chips 12X. Alternatively, the first conductive pads 300X of the first semiconductor chips 11X may be offset in a horizontal direction from the first lower conductive pads 130X of the second semiconductor chips 12X.

The first circuit layer 110X of the second semiconductor chip 12X may be directly bonded to the first dielectric layer 410 of the first semiconductor chip 11X. For example, a lowermost first dielectric layer 111X of the second semiconductor chip 12X may be directly bonded to the second upper dielectric layer 420X of the first semiconductor chip 11X. A chemical bond may be formed between the lowermost first dielectric layer 111X and the second upper dielectric layer 420X.

Before the bonding process of FIGS. 4D and 4E and the dicing process of FIGS. 3A and 3B, as discussed in the examples of the second dielectric layer 420 and the conductive pads 300 in FIG. 1C, a level difference (see A of FIG. 1C) may be provided between the second top surface 420aa of the second upper dielectric layer 420X and the top surfaces 300a of the conductive pads 300. When the level difference A is greater than about 0.1 μm, after the bonding process, the second top surface 420aa of the second upper dielectric layer 420X in each of the first semiconductor chips 11X may not be in contact with the lowermost first dielectric layer 111X of the second semiconductor chip 12X that corresponds to the first semiconductor chip 11X. According to some embodiments, because before the bonding process the level difference A of less than about 0.1 μm is provided between the second top surface 420aa of the second upper dielectric layer 420X and the top surfaces 300a of the conductive pads 300, the second top surface 420aa of the second upper dielectric layer 420X in each of the first semiconductor chips 11X may be, after the bonding process, in contact with the lowermost first dielectric layer 111X of the second semiconductor chip 12X that corresponds to the first semiconductor chip 11X. Therefore, the first top surface 420a and the second top surface 420aa of the second upper dielectric layer 420X in each of the first semiconductor chips 11X may be satisfactorily directly bonded to the lowermost first dielectric layer 111X of the second semiconductor chip 12X.

Referring back to FIG. 4D, the semiconductor chips 10X may further include third semiconductor chips 13X. The third semiconductor chips 13X may have their components substantially the same as those of the first semiconductor chips 11X. For example, each of the third semiconductor chips 13X may include the first semiconductor substrate 100X, the first circuit layer 110X, the first lower conductive pads 130X, the first through vias 200X, the first conductive pads 300X, the first upper dielectric layer 410X, the second upper dielectric layer 420X, the third upper dielectric layer 430X, and the first dielectric patterns 500X.

The third semiconductor chips 13X may be directly disposed on the second semiconductor chips 12X. The second semiconductor chips 12X and the third semiconductor chips 13X may be connected in a direct bonding mode. For example, the first conductive pads 300X of the second semiconductor chips 12X may be directly bonded to the first lower conductive pads 130X of the third semiconductor chips 13X. The first circuit layer 110X of each of the third semiconductor chips 13X may be directly bonded to the second upper dielectric layer 420X of the second semiconductor chip 12X. A chemical bond may be formed between a dielectric layer (not shown) of the first circuit layer 110X in each of the third semiconductor chips 13X and the second upper dielectric layer 420X of the second semiconductor chip 12X that corresponds to the third semiconductor chip 13X.

The number of stacked semiconductor chips 10X may be variously changed.

Upper semiconductor chips 10Y may be stacked on the semiconductor chips 10X. Each of the upper semiconductor chips 10Y may include a second semiconductor substrate 100Y and a second circuit layer 110Y. The second semiconductor substrate 100Y, the second circuit layer 110Y, and the second lower conductive pads 130Y may be correspondingly similar to the semiconductor substrate 100, the circuit layer 110, and the lower conductive pads 130 of FIG. 3C. The upper semiconductor chips 10Y may include none of the conductive pads 300, the through vias 200, the first, second, and third dielectric layers 410, 420, and 430, and the dielectric patterns 500 that are discussed in the examples of the semiconductor device 10 in FIG. 3C.

The upper semiconductor chips 10Y may be directly disposed on the third semiconductor chips 13X. The upper semiconductor chips 10Y and the third semiconductor chips 13X may be connected in a direct bonding mode. For example, the first conductive pads 300X of the third semiconductor chips 13X may be directly bonded to the second lower conductive pads 130Y of the upper semiconductor chips 10Y. A dielectric layer (not shown) included in the second circuit layer 110Y of the upper semiconductor chip 10Y may be directly bonded to the second upper dielectric layer 420X of the third semiconductor chip 13X.

Figure 4F:
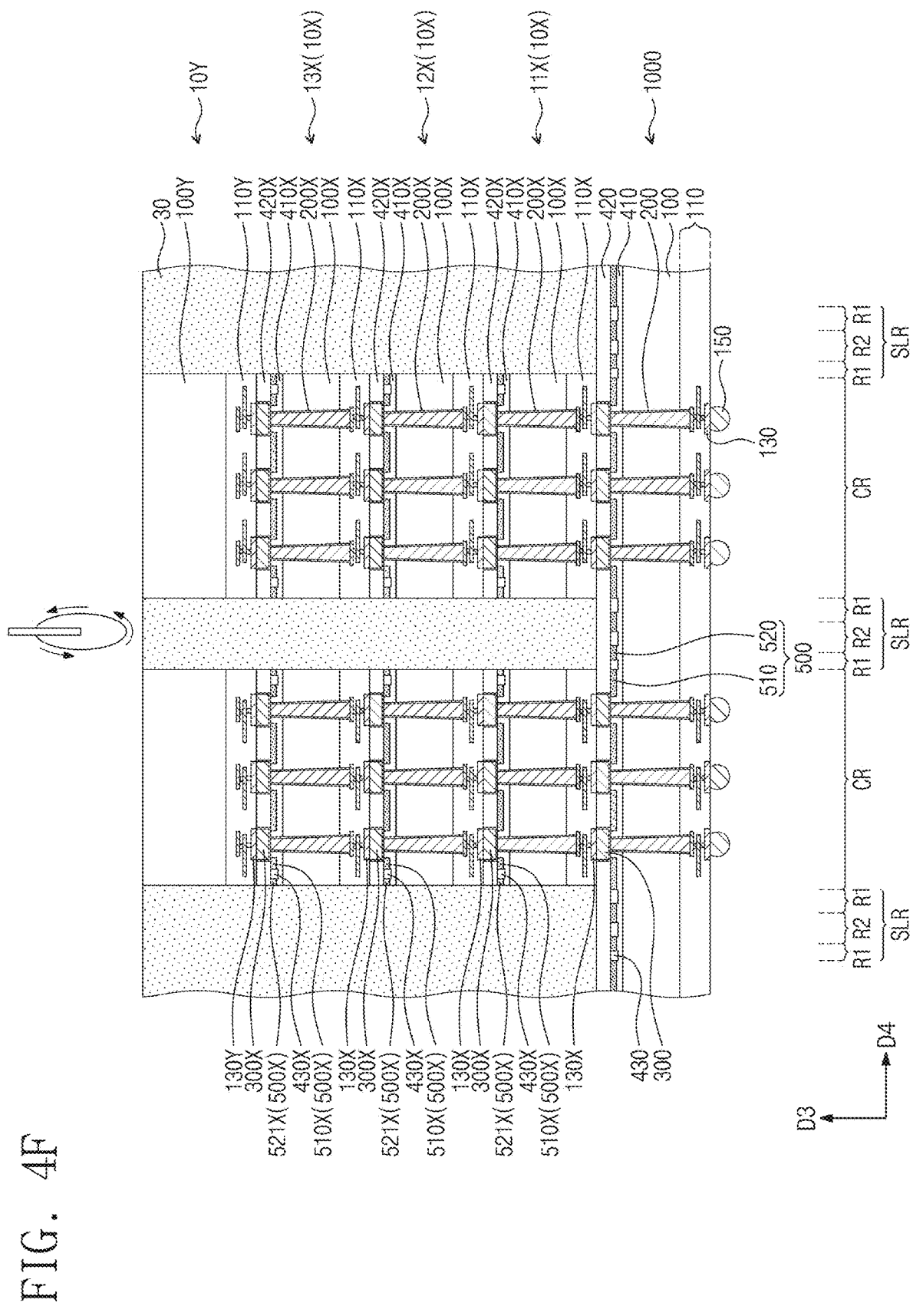

Referring to FIG. 4F, a first molding layer 30 may be formed on the wafer structure 1000 to cover sidewalls of the first, second, and third semiconductor chips 11X, 12X, and 13X and also to cover sidewalls of the upper semiconductor chips 10Y. The first molding layer 30 may expose top surfaces of the upper semiconductor chips 10Y. The first molding layer 30 may be formed in a wafer level. The first molding layer 30 may include a dielectric polymer, such as an epoxy-based molding compound.

Figure 4G:
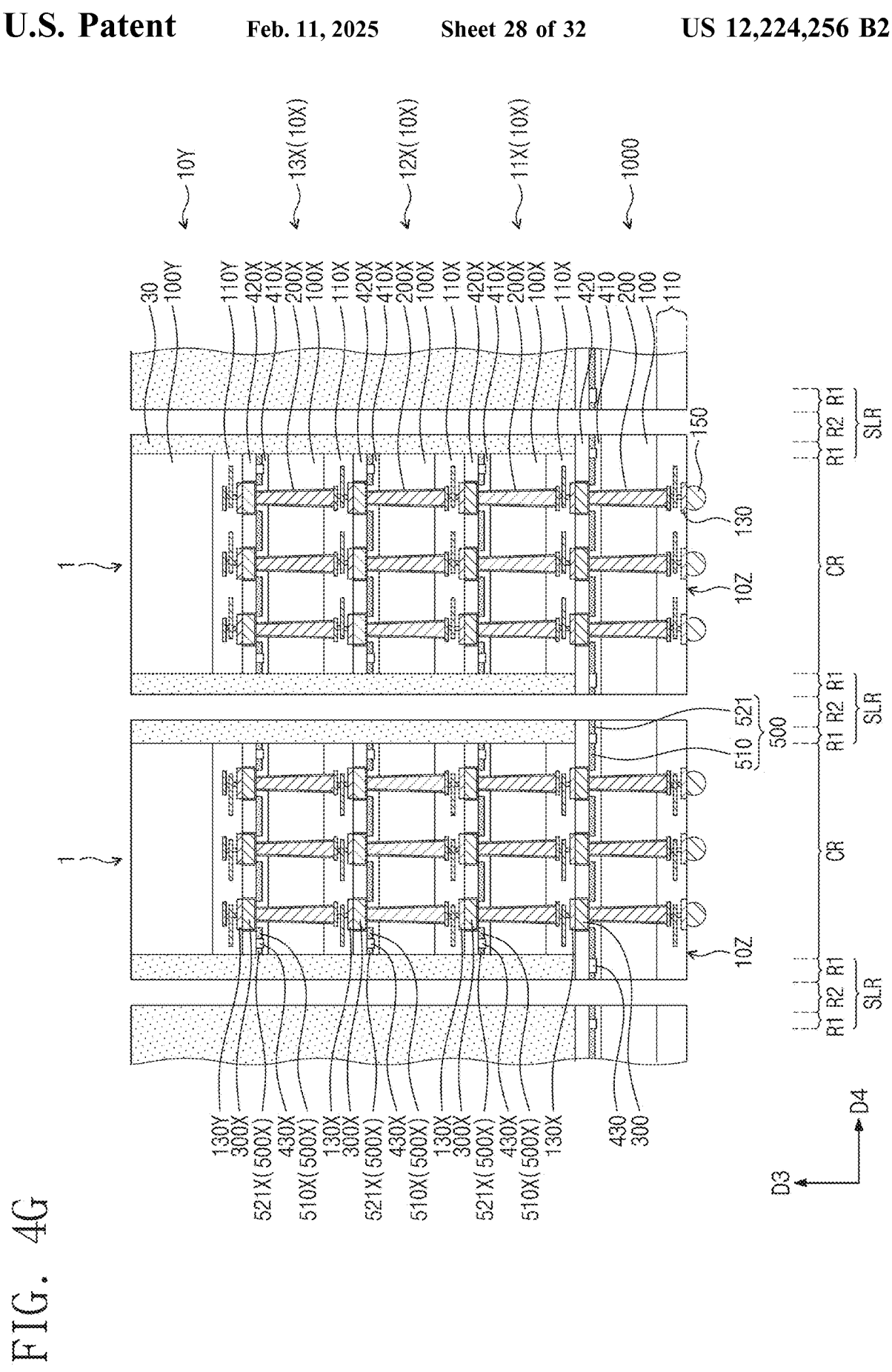

Referring to FIG. 4G, a dicing process may be performed such that the wafer structure 1000 and the first molding layer 30 may be diced along the dicing region R1 of the wafer structure 1000. For example, the dicing process may dice the semiconductor substrate 100, the circuit layer 110, the first dielectric layer 410, the second dielectric layer 420, and the alignment key pattern 520 of the wafer structure 1000. The dicing process may be executed by a method substantially the same as that discussed above in the embodiments of FIGS. 3A and 3B.

As a result of the dicing process, there may be formed a plurality of separated chip stacks 1 and a plurality of separated semiconductor devices 10. Each of the chip stacks 1 may include the semiconductor device 10, the first, second, and third semiconductor chips 11X, 12X, and 13X, the upper semiconductor chip 10Y, and the diced first molding layer 30. The semiconductor devices 10 may be substantially the same as that discussed in the embodiment of FIG. 1C. For example, each of the semiconductor devices 10 may include one of the chip regions CR of the semiconductor substrate 100, the circuit layer 110, the solder balls 150, the through vias 200, the conductive pads 300, the first, second, and third dielectric layers 410, 420, and 430, and the etch stop pattern 510. In addition, each of the semiconductor devices 10 may include the dummy region R2 of the semiconductor substrate 100, the circuit layer 110 on the dummy region R2, and the first, second, and third dielectric layers 410, 420, and 430. After the dicing process, a portion of the alignment key pattern 520 may remain on the dummy region R2 to form a dummy dielectric pattern 521. Therefore, the semiconductor devices 10 may be fabricated. The semiconductor devices 10 may be semiconductor chips, such as logic chips or buffer chips. For example, the semiconductor devices 10 may control its corresponding first, second, and third semiconductor chips 11X, 12X, and 13X and its corresponding upper semiconductor chips 10Y.

Figure 5A:
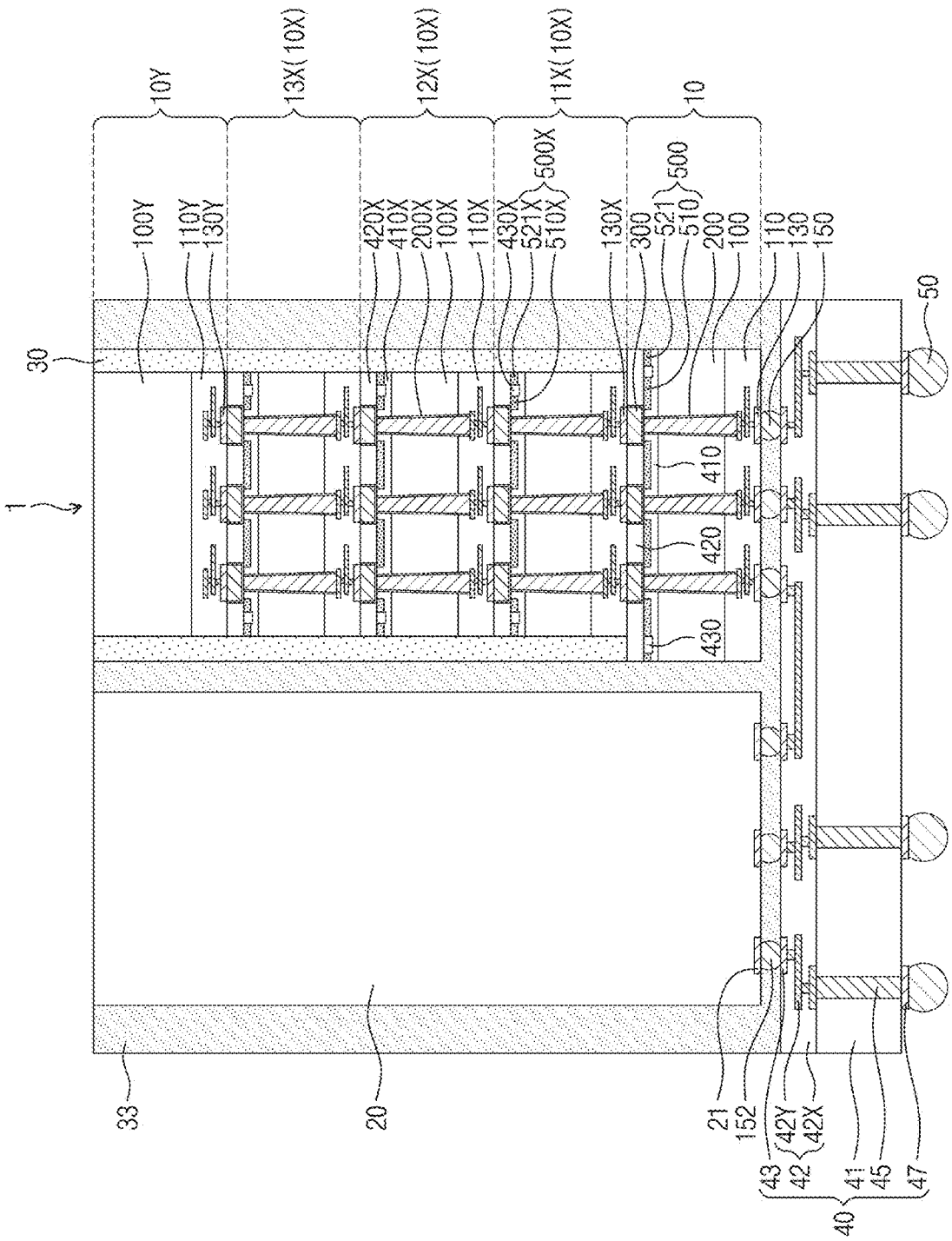
FIG. 5A illustrates a cross-sectional view showing a semiconductor package according to some embodiments.

FIG. 5A illustrates a cross-sectional view showing a semiconductor package according to some embodiments.

Referring to FIG. 5A, a semiconductor package may include a substrate 40, solder terminals 50, and a chip stack 1.

The substrate 40 may be, for example, an interposer substrate. The substrate 40 may include an interposer die 41, via structures 45, a wiring layer 42, and substrate pads 43. The substrate 40 may not include an integrated circuit such as transistors. The interposer die 41 may include a semiconductor die, such as a silicon die, a germanium die, or a silicon-germanium die. The via structures 45 may be provided in the interposer die 41. The via structures 45 may include a conductive material, such as metal. The via structures 45 may be laterally spaced apart from each other. The via structures 45 may penetrate top and bottom surfaces of the interposer die 41.

The wiring layer 42 may be provided on the top surface of the interposer die 41. The wiring layer 42 may include an interposer dielectric layer 42X and metal patterns 42Y. The interposer dielectric layer 42X may include a plurality of layers. The interposer dielectric layer 42X may include a silicon-based dielectric material. The metal patterns 42Y may be provided in the interposer dielectric layer 42X. The metal patterns 42Y may include metal lines and metal vias. The metal vias may be connected to the metal patterns. The metal patterns 42Y may include metal, such as one or more of copper, tungsten, titanium, and any alloy thereof.

The substrate pads 43 may be provided on a top surface of the substrate 40. For example, the substrate pads 43 may be provided on and coupled to the metal patterns 42Y. Two of the substrate pads 43 may be electrically connected to each other through their corresponding metal patterns 42Y. Others of the substrate pads 43 may be electrically connected through corresponding metal patterns 42Y to the via structures 45. The phrase "electrically connected to the substrate 40" may mean that "electrically connected to at least one of the metal patterns 42Y."

The substrate 40 may be provided on its bottom surface with the solder terminals 50 coupled to the via structures 45. The solder terminals 50 may include solder balls. The solder balls may include a solder material, for example, one or more of tin (Sn), silver (Ag), zinc (Zn), and any alloy thereof. The substrate 40 may further include solder pads 47. The solder pads 47 may be interposed between the solder terminals 50 and the via structures 45. The solder pads 47 may include metal different from that of the solder terminals 50.

The chip stack 1 may be fabricated by a method discussed in the embodiments of FIGS. 4A to 4G. The chip stack 1 may include the semiconductor device 10, the solder balls 150, the first, second, and third semiconductor chips 11X, 12X, and 13X, the upper semiconductor chip 10Y, and the first molding layer 30. The chip stack 1 may be mounted on the top surface of the substrate 40. The solder balls 150 may be bonded to the substrate pad 43, and thus the chip stack 1 may be electrically connected to the substrate 40.

The semiconductor package may further include a fourth semiconductor chip 20. The fourth semiconductor chip 20 may be of a different type from the semiconductor device 10, the first, second, and third semiconductor chips 11X, 12X, and 13X, and the upper semiconductor chip 10Y. The fourth semiconductor chip 20 may include a logic chip, a buffer chip, or a system-on-chip (SOC). For example, the fourth semiconductor chip 20 may be a logic chip whose function is different from that of the semiconductor device 10. The fourth semiconductor chip 20 may be an application specific integrated circuit (ASIC) chip or an application processor (AP) chip. The fourth semiconductor chip 20 may include a central processing unit (CPU) or a graphic processing unit (GPU). The fourth semiconductor chip 20 may include chip pads 21 on a bottom surface thereof.

The substrate 40 and the fourth semiconductor chip 20 may be provided therebetween with connection solders 152 coupled to their corresponding substrate pads 43 and their corresponding chip pads 21. The connection solders 152 may include a solder material.

The semiconductor package may further include a second molding layer 33. The substrate 40 may be provided thereon with the second molding layer 33 that covers sidewalls of the chip stack 1 and sidewalls of the fourth semiconductor chip 20. The second molding layer 33 may expose a top surface of the chip stack 1 and a top surface of the fourth semiconductor chip 20. The second molding layer 33 may include a dielectric polymer, such as an epoxy-based molding compound.

Figure 5B:
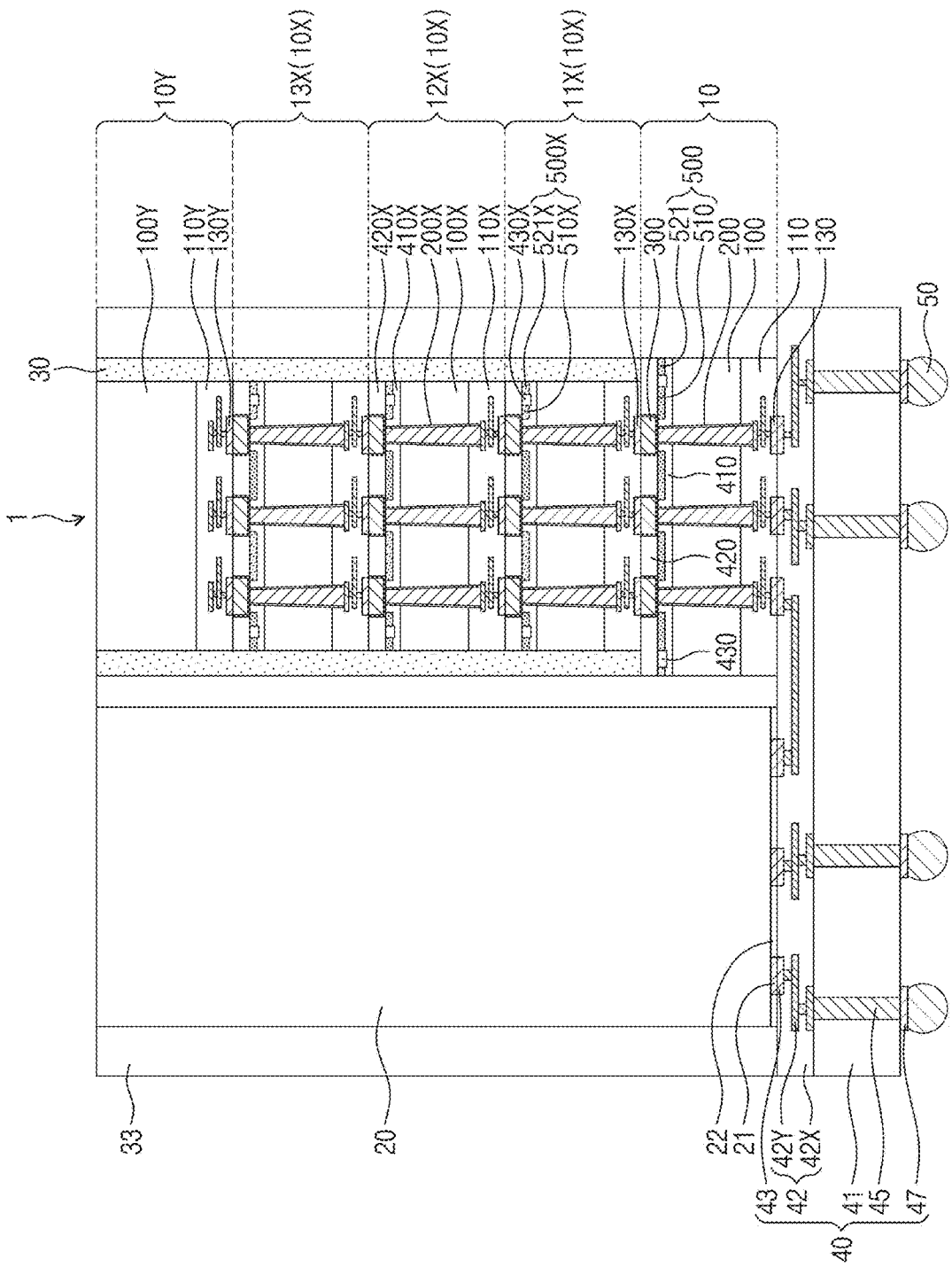
FIG. 5B illustrates a cross-sectional view showing a semiconductor package according to some embodiments.

FIG. 5B illustrates a cross-sectional view showing a semiconductor package according to some embodiments. A duplicate description will be omitted below.

Referring to FIG. 5B, a semiconductor package may include a substrate 40, solder terminals 50, a chip stack 1, a fourth semiconductor chip 20, and a second molding layer 33.

The chip stack 1 may include the semiconductor device 10, the first, second, and third semiconductor chips 11X, 12X, and 13X, the upper semiconductor chip 10Y, and the first molding layer 30. The chip stack 1 may not include the solder balls 150 discussed in FIG. 4G. The chip stack 1 and the substrate 40 may be connected in a direct bonding mode. For example, the lower conductive pads 130 of the semiconductor device 10 may be directly bonded to corresponding substrate pads 43. The circuit layer 110 of the semiconductor device 10 may be in direct contact with and directly bonded to the interposer dielectric layer 42X. A chemical bond may be provided between the interposer dielectric layer 42X and the lowermost dielectric layer (see 111 of FIG. 1C) of the circuit layer 110 in the semiconductor device 10. The interposer dielectric layer 42X may include silicon oxide or silicon carbonitride.

The fourth semiconductor chip 20 may further include a lower dielectric layer 22 on the bottom surface thereof. The lower dielectric layer 22 may include a silicon-based dielectric material, such as silicon oxide or silicon carbonitride. The fourth semiconductor chip 20 and the substrate 40 may be connected in a direct bonding mode. For example, the chip pads 21 of the fourth semiconductor chip 20 may be directly bonded to corresponding substrate pads 43. The lower dielectric layer 22 may be directly bonded to the interposer dielectric layer 42X. A chemical bond may be provided between the lower dielectric layer 22 and the interposer dielectric layer 42X.

Figure 6A:
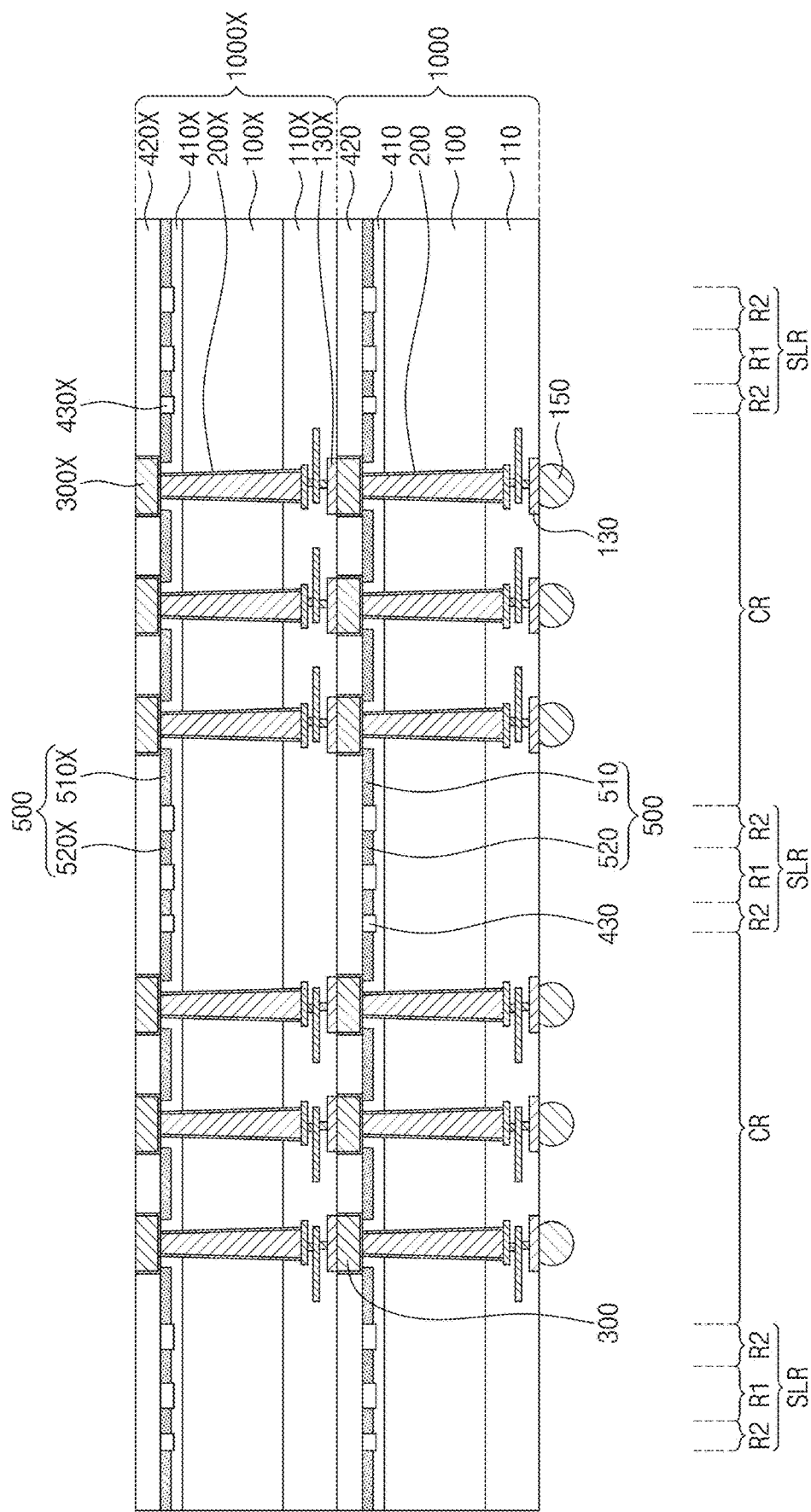
FIGS. 6A and 6B illustrate cross-sectional views showing a method of bonding a wafer structure and a method of fabricating a semiconductor device according to some embodiments.
Figure 6B:
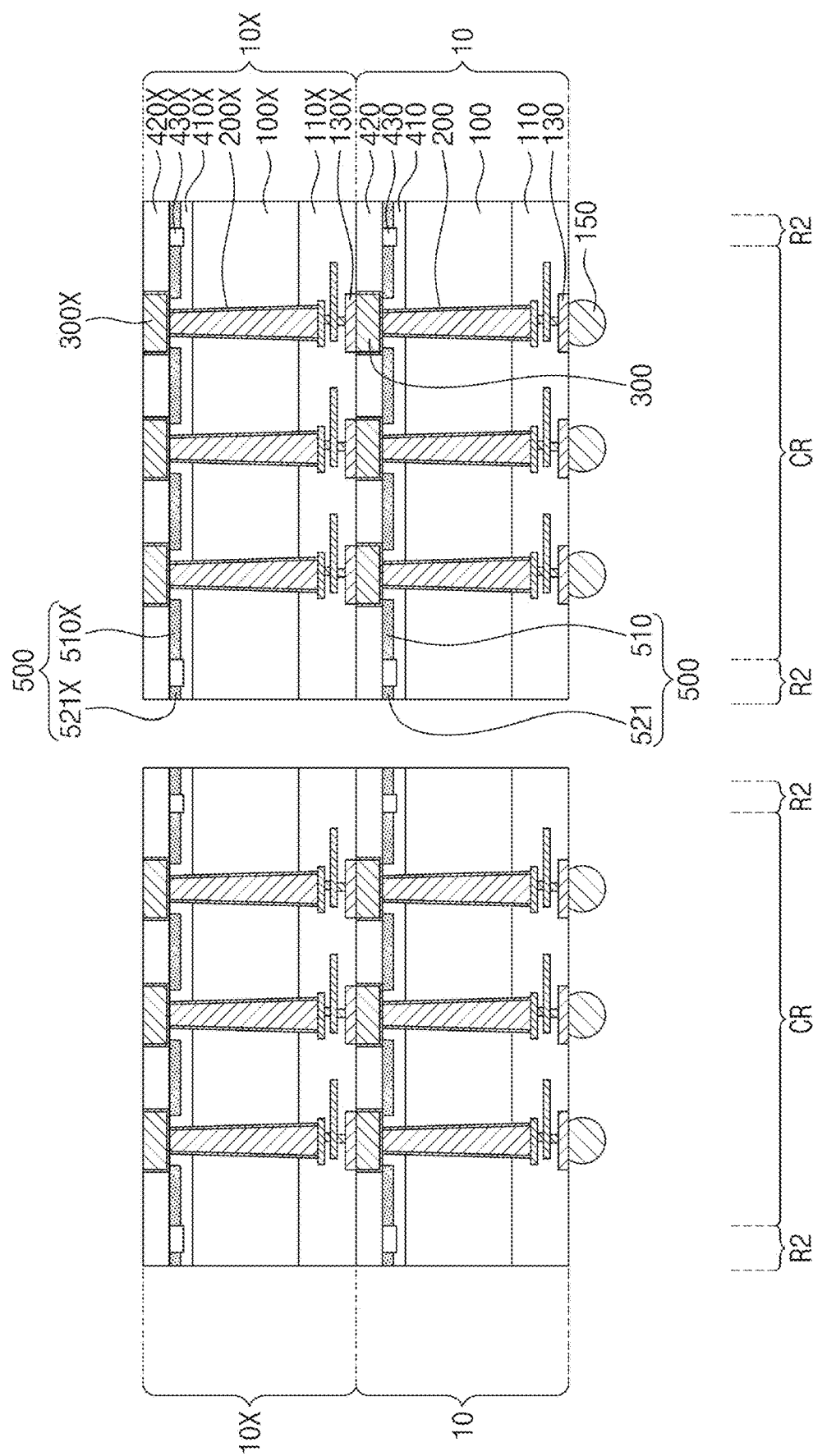

FIGS. 6A and 6B illustrate cross-sectional views showing a method of bonding a wafer structure and a method of fabricating a semiconductor device according to some embodiments.

Referring to FIG. 6A, a wafer structure 1000 and a first wafer structure 1000X may be prepared. The wafer structure 1000 may be substantially the same as that discussed in the embodiments of FIGS. 1A to 1D.

The first wafer structure 1000X may be substantially the same as the wafer structure 1000 discussed in FIGS. 1A to 1D. For example, the first wafer structure 1000X may include a first semiconductor substrate 100X, a first circuit layer 110X, first lower conductive pads 130X, first through vias 200X, first conductive pads 300X, a first upper dielectric layer 410X, a second upper dielectric layer 420X, a third upper dielectric layer 430X, and first dielectric patterns 500X. The first dielectric patterns 500X may include a first etch stop pattern 510X and a first alignment key pattern 520X. The first wafer structure 1000X may not include the solder balls 150.

The first wafer structure 1000X and the wafer structure 1000 may be connected in a direct bonding mode. The direct bonding between the first wafer structure 1000X and the wafer structure 1000 may be performed by a method substantially the same as that discussed in the examples of the direct bonding between the first semiconductor chips 11X and the wafer structure 1000 of FIGS. 4A to 4C. For example, the first lower conductive pads 130X of the first wafer structure 1000X may be directly bonded to the conductive pads 300 of the wafer structure 1000. The first circuit layer 110X may be directly bonded to the second dielectric layer 420. For example, a chemical bond may be formed between the second dielectric layer 420 and the lowermost dielectric layer 111 included in the first circuit layer 110X.

Referring to FIG. 6B, a dicing process may be performed such that the wafer structure 1000 and the first wafer structure 1000X may be diced along the dicing region R1 of the wafer structure 1000. The dicing process may be executed by a method substantially the same as that discussed above in the embodiments of FIGS. 3A and 3B.

The wafer structure 1000 may be diced to form semiconductor devices 10 that are separated from each other. A portion of the alignment key pattern 520 may remain on the dummy region R2 to form a dummy dielectric pattern 521. Each of the semiconductor devices 10 may be substantially the same as the semiconductor device 10 of FIG. 1C. For example, each of the semiconductor devices 10 may include the semiconductor substrate 100, the solder balls 150, the circuit layer 110, the lower conductive pads 130, the through vias 200, the conductive pads 300, the first, second, and third dielectric layers 410, 420, and 430, the etch stop pattern 510, and the dummy dielectric pattern 521.

The first wafer structure 1000X may be diced to form semiconductor chips 10X that are separated from each other. After the dicing process, a portion of the first alignment key pattern 520X may remain on the dummy region R2 to form a dummy dielectric pattern 521X. Each of the semiconductor chips 10X may include the first semiconductor substrate 100X, the first circuit layer 110X, the first lower conductive pads 130X, the first through vias 200X, the first conductive pads 300X, the first, second, and third upper dielectric layers 410X, 420X, and 430X, the first etch stop pattern 510X, and the first dummy dielectric pattern 521X.

The semiconductor chips 10X may be directly bonded to the semiconductor devices 10.

According to some embodiments of the present inventive concepts, a wafer structure may include a dielectric pattern. The dielectric pattern may include an alignment key pattern and an etch stop pattern. Therefore, metal residues may be prevented or reduced from being generated in a dicing process performed on the wafer structure. A semiconductor device may be fabricated in high yield and may have increased reliability.

A dicing tool may be prevented or reduced from damage during the dicing process.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

It will be understood that when an element such as a layer, film, region, or substrate is referred to as being "on" another element, it may be directly on the other element or intervening elements may also be present. In contrast, when an element is referred to as being "directly on" another element, there are no intervening elements present. It will further be understood that when an element is referred to as being "on" another element, it may be above or beneath or adjacent (e.g., horizontally adjacent) to the other element.

It will be understood that elements and/or properties thereof (e.g., structures, surfaces, directions, or the like), which may be referred to as being "perpendicular," "parallel," "coplanar," or the like with regard to other elements and/or properties thereof (e.g., structures, surfaces, directions, or the like) may be "perpendicular," "parallel," "coplanar," or the like or may be "substantially perpendicular," "substantially parallel," "substantially coplanar," respectively, with regard to the other elements and/or properties thereof.

Elements and/or properties thereof (e.g., structures, surfaces, directions, or the like) that are "substantially perpendicular" with regard to other elements and/or properties thereof will be understood to be "perpendicular" with regard to the other elements and/or properties thereof within manufacturing tolerances and/or material tolerances and/or have a deviation in magnitude and/or angle from "perpendicular," or the like with regard to the other elements and/or properties thereof that is equal to or less than 10% (e.g., a. tolerance of ±10%).

Elements and/or properties thereof (e.g., structures, surfaces, directions, or the like) that are "substantially parallel" with regard to other elements and/or properties thereof will be understood to be "parallel" with regard to the other elements and/or properties thereof within manufacturing tolerances and/or material tolerances and/or have a deviation in magnitude and/or angle from "parallel," or the like with regard to the other elements and/or properties thereof that is equal to or less than 10% (e.g., a. tolerance of ±10%)

This detailed description of the present inventive concepts should not be construed as limited to the embodiments set forth herein, and it is intended that the present inventive concepts cover the various combinations, the modifications and variations of the inventive concepts without departing from the spirit and scope of the present inventive concepts.

What is claimed is:

1. A wafer structure, comprising:
   a semiconductor substrate that includes a chip region and a scribe lane region;
   a first dielectric layer on a first surface of the semiconductor substrate;
   a second dielectric layer on the first dielectric layer;
   a dielectric pattern between the first dielectric layer and the second dielectric layer;
   a through via that penetrates the first surface and a second surface at the chip region of the semiconductor substrate; and
   a conductive pad in the second dielectric layer and on the through via,
   wherein the dielectric pattern includes:
      an etch stop pattern on the chip region of the semiconductor substrate and in contact with a bottom surface of the conductive pad; and
      an alignment key pattern on the scribe lane region of the semiconductor substrate.

2. The wafer structure of claim 1, wherein the etch stop pattern is spaced apart from the alignment key pattern.

3. The wafer structure of claim 1, further comprising a third dielectric layer on the first dielectric layer,
   wherein the third dielectric layer is between the etch stop pattern and the alignment key pattern.

4. The wafer structure of claim 3, wherein the dielectric pattern includes a material different from a material of the first dielectric layer and different from a material of the second dielectric layer.

5. The wafer structure of claim 4, wherein the third dielectric layer includes a same material as the material of the first dielectric layer and the material of the second dielectric layer.

6. The wafer structure of claim 1, wherein the etch stop pattern is spaced apart from a sidewall of the through via.

7. The wafer structure of claim 6, wherein the first dielectric layer includes an extension portion,
   wherein the extension portion is between the etch stop pattern and the sidewall of the through via.

8. The wafer structure of claim 1, wherein the second dielectric layer has:
   a first top surface on the chip region; and
   a second top surface on the scribe lane region,
   wherein the first top surface is substantially coplanar with a top surface of the conductive pad, and
   wherein the second top surface is at a level lower than a level of the top surface of the conductive pad.

9. The wafer structure of claim 8, wherein a level difference between the top surface of the conductive pad and the second top surface of the second dielectric layer is in a range of about 0.01 μm to about 0.1 μm.

10. The wafer structure of claim 1, wherein a width of the alignment key pattern is greater than a width of the conductive pad.

11. A semiconductor device, comprising:
   a semiconductor substrate that has a chip region and a dummy region that surrounds the chip region, in a plan view;
   a first dielectric layer on a first surface of the semiconductor substrate;
   a second dielectric layer on the first dielectric layer;
   a dielectric pattern between the first dielectric layer and the second dielectric layer;
   a through via that penetrates the first surface and a second surface at the chip region of the semiconductor substrate; and
   a conductive pad in the second dielectric layer and on the through via,
   wherein the dielectric pattern is spaced apart from a sidewall of the through via, and wherein the dielectric pattern includes:
an etch stop pattern on the chip region of the semiconductor substrate and in contact with a bottom surface of the conductive pad; and
a dummy dielectric pattern on the dummy region of the semiconductor substrate.

12. The semiconductor device of claim 11, wherein an outer sidewall of the dummy dielectric pattern is exposed by the first dielectric layer and the second dielectric layer.

13. The semiconductor device of claim 11, wherein the dummy dielectric pattern is a dummy alignment key pattern.

14. The semiconductor device of claim 11, wherein the first dielectric layer extends between the etch stop pattern and the sidewall of the through via and is in contact with the sidewall of the through via.

15. The semiconductor device of claim 11, wherein a top surface of the through via is at substantially a same level as a level of a top surface of the etch stop pattern and a level of a top surface of the dummy dielectric pattern.

16. The semiconductor device of claim 11, further comprising a third dielectric layer on the first dielectric layer,
wherein the dummy dielectric pattern is spaced apart from the etch stop pattern, and
wherein the third dielectric layer is between the etch stop pattern and the dummy dielectric pattern.

17. The semiconductor device of claim 16, wherein
the dielectric pattern includes a material different from a material of the first dielectric layer, a material of the second dielectric layer, and a material of the third dielectric layer, and
the etch stop pattern includes a same material as a material of the dummy dielectric pattern.

18. A wafer structure, comprising:
a semiconductor substrate that includes a chip region and a scribe lane region and having a first surface and a second surface;
a plurality of integrated circuits on the second surface at the chip region of the semiconductor substrate;
a circuit layer on the second surface of the semiconductor substrate, the circuit layer including a dielectric layer and a wiring structure, the wiring structure being in the dielectric layer and coupled to the integrated circuits;
a lower conductive pad on a bottom surface of the circuit layer and coupled to the wiring structure;
a first dielectric layer on the first surface at the chip region and the scribe lane region of the semiconductor substrate;
a second dielectric layer on the first dielectric layer;
a dielectric pattern between the first dielectric layer and the second dielectric layer;
a through via that penetrates the first dielectric layer and the chip region of the semiconductor substrate; and
a conductive pad in the second dielectric layer and on the through via, the conductive pad being coupled to the through via,
wherein the through via includes a barrier pattern and a conductive via,
wherein the barrier pattern is between the semiconductor substrate and the conductive via,
wherein the conductive pad includes a barrier pad and a metal pad on the barrier pad,
wherein the dielectric pattern includes a material different from a material of the first dielectric layer and a material different from the second dielectric layer, and
wherein the dielectric pattern includes:
an etch stop pattern on the chip region of the semiconductor substrate and in contact with a bottom surface of the conductive pad; and
an alignment key pattern on the scribe lane region of the semiconductor substrate.

19. The wafer structure of claim 18, further comprising a third dielectric layer on the first dielectric layer,
wherein the third dielectric layer is between the etch stop pattern and the alignment key pattern, and
wherein the third dielectric layer overlaps the scribe lane region of the semiconductor substrate.

20. The wafer structure of claim 18, wherein
the chip region includes a plurality of chip regions, the plurality of chip regions being arranged along rows parallel to a first direction and along columns parallel to a second direction perpendicular to the first direction,
a width in the first direction of the etch stop pattern is in a range of about 30 μm to about 180 μm, and
a width in the second direction of the etch stop pattern is in a range of about 30 μm to about 180 μm.

* * * * *